(12) United States Patent
Blomberg et al.

(10) Patent No.: US 11,230,769 B2
(45) Date of Patent: *Jan. 25, 2022

(54) THERMAL ATOMIC LAYER ETCHING PROCESSES

(71) Applicant: ASM IP Holding B.V., Almere (NL)

(72) Inventors: Tom E. Blomberg, Vantaa (FI); Varun Sharma, Helsinki (FI); Suvi P. Haukka, Helsinki (FI); Marko J. Tuominen, Espoo (FI); Chiyu Zhu, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/881,718

(22) Filed: May 22, 2020

(65) Prior Publication Data

US 2020/0308709 A1 Oct. 1, 2020

Related U.S. Application Data

(63) Continuation of application No. 16/390,385, filed on Apr. 22, 2019, now Pat. No. 10,662,533, which is a
(Continued)

(51) Int. Cl.
*C23F 4/02* (2006.01)
*C23F 1/12* (2006.01)
(Continued)

(52) U.S. Cl.
CPC ............... *C23F 4/02* (2013.01); *C09K 13/00* (2013.01); *C09K 13/08* (2013.01); *C09K 13/10* (2013.01); *C23F 1/12* (2013.01); *H01J 37/32009* (2013.01); *H01J 37/3244* (2013.01); *H01L 21/3065* (2013.01); *H01L 21/31116* (2013.01);
(Continued)

(58) Field of Classification Search
None
See application file for complete search history.

(56) References Cited

U.S. PATENT DOCUMENTS 7,911,001 B2  3/2011 Lee et al.
8,632,687 B2  1/2014 Auth et al.
(Continued)

FOREIGN PATENT DOCUMENTS

JP  H05206088  8/1993
JP  H08176851  7/1996
(Continued)

OTHER PUBLICATIONS

File History of U.S. Appl. No. 16/930,800, filed Jul. 16, 2020.
(Continued)

*Primary Examiner* — Roberts P Culbert
(74) *Attorney, Agent, or Firm* — Knobbe, Martens, Olson & Bear LLP

(57) ABSTRACT

Thermal atomic layer etching processes are disclosed. In some embodiments, the methods comprise at least one etch cycle in which the substrate is alternately and sequentially exposed to a first vapor phase halide reactant and a second vapor halide reactant. In some embodiments, the first reactant may comprise an organic halide compound. During the thermal ALE cycle, the substrate is not contacted with a plasma reactant.

31 Claims, 9 Drawing Sheets

Related U.S. Application Data continuation of application No. 15/835,212, filed on Dec. 7, 2017, now Pat. No. 10,273,584.

(60) Provisional application No. 62/485,330, filed on Apr. 13, 2017, provisional application No. 62/455,989, filed on Feb. 7, 2017, provisional application No. 62/449,945, filed on Jan. 24, 2017, provisional application No. 62/432,318, filed on Dec. 9, 2016.

(51) Int. Cl.
| | |
|---|---|
| H01L 21/3213 | (2006.01) |
| C09K 13/00 | (2006.01) |
| H01L 21/311 | (2006.01) |
| C09K 13/08 | (2006.01) |
| C09K 13/10 | (2006.01) |
| H01J 37/32 | (2006.01) |
| H01L 21/3065 | (2006.01) |

(52) U.S. Cl.
CPC .. H01L 21/31122 (2013.01); H01L 21/32135 (2013.01); *H01L 21/31138* (2013.01)

(56) References Cited

U.S. PATENT DOCUMENTS

| | | |
|---|---|---|
| 9,257,638 B2 | 2/2016 | Tan et al. |
| 9,396,956 B1 | 7/2016 | Fukazawa |
| 9,425,041 B2 | 8/2016 | Berry et al. |
| 9,735,024 B2 | 8/2017 | Zaitsu |
| 10,056,264 B2 | 8/2018 | Yang et al. |
| 2014/0273492 A1 | 9/2014 | Anthis |
| 2015/0218695 A1 | 8/2015 | Odedra |
| 2016/0307764 A1 | 10/2016 | Gupta et al. |
| 2016/0308112 A1 | 10/2016 | Tan et al. |
| 2016/0329221 A1 | 11/2016 | Berry et al. |

FOREIGN PATENT DOCUMENTS

| | | |
|---|---|---|
| JP | 2004-063633 | 2/2004 |
| KR | 10-1997-0009860 | 3/1997 |
| KR | 10-0707983 | 4/2007 |
| KR | 10-2011-0098355 | 9/2011 |
| KR | 10-1465338 | 11/2014 |
| TW | 201525173 | 7/2015 |
| TW | 201608662 | 3/2016 |
| WO | WO 2015/160412 | 10/2015 |
| WO | WO 2016/100873 | 6/2016 |
| WO | WO 2016/160778 | 10/2016 |
| WO | WO 2016/172740 | 10/2016 |
| WO | WO 2017/099718 | 6/2017 |
| WO | WO 2017/205658 | 11/2017 |
| WO | WO 2017/213842 | 12/2017 |
| WO | WO 2018/106955 | 6/2018 |

OTHER PUBLICATIONS

File History of U.S. Appl. No. 16/930,867, filed Jul. 16, 2020.
"Chemicals Used in Chip Fabrication," GAPS Guidelines GAP.17.1.1.B, Global Asset Protection Services LLC, 2015, pp. 1-4.
"Inorganic Analysis," Analyst, 1921,46, pp. 157-161.
"Safetygram #25", Air Products and Chemicals, Inc., 2004 in 8 pages.
"SO3 Gas-Phase Cleaning Process," Final Report, ANON Inc., San Jose, California, 1999, in 19 pages.
"Insights for Electronics Manufacturing", Solid State Technology, Jul. 2016, vol. 59, No. 5, pp. 1-52.
"Xenon Difluoride (XeF2)," Versum Materials, LLC, 2016, in 2 pages.
Barton et al., "The Dissociation of Sulfur Monochloride Vapor," J. Am. Chem. Soc., Feb. 1935, vol. 57 (2), pp. 307-310.
Brandão et al., "Synthesis, Characterization and use of Nb2O5 based Catalysts in Producing Biofuels by Transesterification, Esterification and Pyrolysis," J. Braz. Chem. Soc., 2009, vol. 20, No. 5, pp. 954-966.
Bock et al., "Unstable Intermediates in the Gaseous Phase: The Thermal Decomposition of Acyl Chlorides RCOC1," Angew. Chem. Int. Ed. Engl., 16, (1977) No. 2, pp. 105-107.
Chaiken et al., "Rate of Sublimation of Ammonium Halides," The Journal of Chemical Physics 37, 2311 (1962), in 9 pages.
Chalker, P.R., "Photochemical Atomic Layer Deposition and Etching," Surface & Coatings Technology, 291, (2016), pp. 258-263.
Coman et al., "NbF5—AlF3 Catalysts: Design, Synthesis, and Application in Lactic Acid Synthesis from Cellulose", ACS Catal., 2015, 5 (5), pp. 3013-3026.
Dumont et al., "Competition Between Al2O3 Atomic Layer Etching and AlF3 Atomic Layer Deposition Using Sequential Exposures of Trimethylaluminum and Hydrogen Fluoride." The Journal of Chemical Physics, 146, (2017), pp. 052819-1-052819-10.
Dumont et al., "Thermal Atomic Layer Etching of SiO2 by a "Conversion-Etch" Mechanism Using Sequential Reactions of Trimethylaluminum and Hydrogen Fluoride," ACS Appl. Mater. Interfaces, 2017, 9, pp. 10296-10307.
File History of U.S. Appl. No. 15/835,272, filed Dec. 7, 2017.
File History of U.S. Appl. No. 16/390,319, filed Apr. 22, 2019.
File History of U.S. Appl. No. 16/881,868, filed May 22, 2020.
File History of U.S. Appl. No. 15/835,212, filed Dec. 7, 2017.
File History of U.S. Appl. No. 16/390,385, filed Apr. 22, 2019.
File History of U.S. Appl. No. 15/835,262, filed Dec. 7, 2017.
File History of U.S. Appl. No. 16/390,540, filed Apr. 22, 2019.
File History of U.S. Appl. No. 16/881,885, filed May 22, 2020.
Jackson et al., "Optimizing AlF3 Atomic Layer Deposition Using Trimethylaluminum and TaF5: Application to High Voltage Li-ion Battery Cathodes," Journal of Vacuum Science & Technology A 34, 2016, pp. 031503-1-031503-8.
Johnson et al., Thermal Atomic Layer Etching of Crystalline Aluminum Nitride Using Sequential, Selflimiting Hydrogen Fluoride and Sn(acac)2 Reactions and Enhancement by H2 and Ar.
Johnson et al., "WO3 and W Thermal Atomic Layer Etching Using "Conversion Fluorination" and "Oxidation-Conversion-Fluorination" Mechanisms", ACS Appl. Mater. Interfaces, 2017, 9, pp. 34435-34447.
Huardyiting Zhang, et al., "Atomic Layer Etching of 3D Structures in Silicon: Self-limiting and Nonideal Reactions," Journal of Vacuum Science & Technology A, 2017, pp. 031306-1-031306-15.
Kanarik et al., "Overview of Atomic Layer Etching in the Semiconductor Industry," Journal of Vacuum Science & Technology A: Vacuum, Surfaces, and Films 33, 2015, pp. 020802-1-020802-14.
Kastenmeier et al., "Remote Plasma Etching of Silicon Nitride and Silicon Dioxide Using NF3/02 Gas Mixtures," Journal of Vacuum Science & Technology A, 1998, pp. 2047-2056.
Kastenmeier et al., "Surface Etching Mechanism of Silicon Nitride in Fluorine and Nitric Oxide Containing Plasmas," Journal of Vacuum Science & Technology A, 2001, pp. 25-30.
Kepten, et al., "Studies of the Possible Reaction of WF6 with SiO2 and Si3N4 at Several Temperatures." J. Electrochem. Soc., vol. 139, No. 8, Aug. 1992, pp. 2331-2337.
Knapas et al., "Etching of Nb2O5 Thin Films by NbCl5", Chemical Vapor Deposition, 2009, vol. 15, pp. 269-273.
Kohli et al., "Methods for Removal of Particle Contaminants," Developments in Surface Contamination and Cleaning, vol. 3, 2011, in 259 pages.
Kuhle, Engelbert, "One Hundred Years of Sulferic Acid Chemistry, 11b. Substitution and Cyclization Reactions of Sulfenyl Halides", Dec. 1971, pp. 617-638.
Lee et al., "Atomic Layer Etching of HfO2 Using Sequential, Self-Limiting Thermal Reactions with Sn(acac)2 and HF", ECS Journal of Solid State Science and Technology, 4 (6), 2015, pp. N5013-N5022.
Lee et al., "Atomic Layer Etching Al2O3 Using Sequential, Self-Limiting Thermal Reactions with Sn(acac)2 and Hydrogen Fluoride", ACS Nano, 9 (2), 2015, pp. 2061-2070.

(56) References Cited

OTHER PUBLICATIONS

Lee et al., "Selectivity in Atomic Layer Etching Using Sequential, Self-Limiting Thermal Reactions," ACS Nano 9, 2061, 2015, in 29 pages.

Lee et al., "Thermal Atomic Layer Etching of Titanium Nitride Using Sequential, Self-Limiting Reactions: Oxidation to TiO2 and Fluorination to Volatile TiF4", Chem. Mater., 2017, 29, pp. 8202-8210.

Lenher, Victor, "Some Properties on Selenium Oxychloride", Contribution from the Department of Chemistry, University of Wisconsin, May 26, 1922, pp. 1664-1667.

Luna, Adolfo E. Castro, "Vapor Pressure of WOCl4", J. Chem. Eng. Data, 1983, 28, p. 349.

McDonald et al., "Corrosion of Steel and Nickel Alloys in Neutral and Acidic Solutions of Thionyl Chloride and Sulfuryl Chloride," Journal of the Electrochemical Society, Jun. 1988, pp. 1313-1316.

Michalski et al., "A New Approach towards Organophosphorus Sulfenyl and Selenyl Halides, Phosphorus and Sulfur and the Related Elements", 30:1-2, Jan. 3, 2007, pp. 221-224.

Nieder-Vahrenholz, et al., "Die Oxidfluoride des Niobs und Tantals", Journal of Inorganic and General Chemistry, Zeitschrift für anorganische Chemie, vol. 544, 1, Jan. 1987, pp. 122-126.

Oehrlein, et al., "Atomic Layer Etching at the Tipping Point: An Overview", ECS Journal of Solid State Science and Technology, 4 (6), Mar. 27, 2015, pp. N5041-N5053.

Painter, Edgar Page, "The Chemistry and Toxicity of Selenium Compounds, with Special Reference to the Selenium Problem," Chem. Rev., Apr. 1941, 28 (2), pp. 179-213.

Pop et al., "New Group 11 Complexes with Metal-Selenium Bonds of Methyldiphenylphosphane Selenide: A Solid State, Slution and Theoretical Investigation," Dalton Trans., 2011, 40, pp. 12479-12490.

Rivillon et al., "Chlorination of Hydrogen-Terminated Silicon (111) Surfaces," J. Vac. Sci. Technol. A 23, Jul./Aug. 2005, pp. 1100-1106.

Shinoda et al., "Thermal Cyclic Etching of Silicon Nitride Using Formation and Desorption of Ammonium Fluorosilicate," Applied Physics Express 9, 2016, pp. 106201-1-106201-3.

Société chimique de France. Auteur du texte, "Bulletin de la Société chimique de Paris", L. Hachette; Masson, 1871, p. 47.

Sprenger et al., "Electron-enhanced atomic layer deposition of silicon thin films at room temperature", J. Vac. Sci. Technol. A 36(1), Jan./Feb. 2018, pp. 01A118-1-01A118-10.

Suresh B.S., et al., "A Study of the Reaction of Silicon Tetrahalides with Phosphorus Pentoxide and of Alkali Metal Fluorosilicates with Phosphorus Pentoxide and Sulphur Trioxide," Journal of Fluorine, 24, 1984, pp. 399-407.

Svistunova, I.V., "Boron Difluoride Acetylacetonate Sulfenyl (Selenyl) Halides," Russian Journal of General Chemistry, 2010, vol. 80, No. 12, pp. 2430-2437.

Vallée, et al., "Selective Deposition Process Combining PEALD and ALE ex: Ta2O5 and TiO2," Powerpoint presentation at the 2017 ALD Conference, in 53 pages.

THERMAL ATOMIC LAYER ETCHING PROCESSES

CROSS-REFERENCE TO RELATED APPLICATIONS

This application is a continuation of U.S. application Ser. No. 16/390,385, filed Apr. 22, 2019, which is a continuation of U.S. application Ser. No. 15/835,212, filed Dec. 7, 2017, now U.S. Pat. No. 10,273,584, which claims priority to U.S. Provisional Application No. 62/432,318, filed Dec. 9, 2016, U.S. Provisional Application No. 62/449,945, filed Jan. 24, 2017, U.S. Provisional Application No. 62/455,989, filed Feb. 7, 2017, and U.S. Provisional Application No. 62/485,330, filed Apr. 13, 2017.

BACKGROUND OF THE INVENTION

Field of the Invention

The present application relates to etching processes, more particularly to thermal atomic layer etching processes using sequential reactions.

Description

Vapor deposition processes such as atomic layer deposition (ALD) are well-known. ALD processes typically utilize alternating and sequential pulses of vapor-phase reactants to deposit up to a monolayer of material in a controlled and highly-conformal manner. Thin films deposited by ALD are used in a wide variety of applications, such as in the formation of integrated circuits. Controlled removal of materials is also highly desirable. In contrast to ALD, atomic layer etching (ALE) utilizes sequential pulses of vapor phase reactants to remove material from a substrate in each reaction cycle. Typical ALE processes utilize a first reactant to form a first species on the substrate surface that is then removed by a second, excited species generated from a plasma.

SUMMARY OF THE INVENTION

In some embodiments, a film on a substrate is etched in a reaction chamber by a chemical atomic layer etching process comprising one or more etch cycles. Each etch cycle comprises exposing the substrate to a first vapor-phase halide reactant, such as a non-metal halide reactant, to form adsorbed species on the substrate sirface and subsequently exposing the substrate to a second vapor-phase reactant, wherein the second vapor-phase reactant converts the adsorbed species into volatile species that comprise one or more atoms from the surface to be etched. In this way at least some material is removed from the film in each etch cycle.

In some embodiments, the first vapor-phase halide reactant, such as non-metal halide reactant comprises a first halide ligand and the second vapor-phase reactant comprises a second halide ligand. In some embodiments, the substrate is not contacted with a plasma reactant during the etching cycle. In some embodiments, the etching cycle is repeated two or more times. In some embodiments the first vapor-phase halide reactant may comprise metal.

In some embodiments, the volatile adduct comprises an atrane compound. In some embodiments, the atrane compound is formed from tris(2-aminoethyl)amine or triethanolamine.

In some embodiments, the film comprises at least one of W, TiN, $TiO_2$, TaN, SiN, SiOx, $AlO_x$, $AlO_2$, $Al_2O_3$, $ZrO_x$, $ZrO_2$, $WO_3$, SiOCN, SiOC, SiCN, AlN and $HfO_2$.

In some embodiments, the surface to be etched comprises a metal nitride such as TiN or TaN and the second vapor-phase reactant comprises a Lewis acid.

In some embodiments, the first vapor-phase halide reactant comprises a metal halide. In some embodiments, the metal comprises Nb, Ta, Mo, Sn, V, Re, W, or group 5 or 6 transition metal. In some embodiments, the first vapor-phase halide reactant comprises Sb or Te. In some embodiments, the halide comprises chlorides, fluorides, bromides, or iodides. In some embodiments, the first vapor-phase halide reactant comprises $NbF_5$.

In some embodiments, the first vapor-phase halide reactant does not comprise a metal. In some embodiments, the first vapor-phase halide reactant comprises an organic halide compound. In some embodiments, the first vapor-phase halide reactant comprises an alkyl halide, an acyl halide, a sulfonyl halide, a sulfenyl halide, a selenyl halide, or a boron halide comprising an organic ligand.

In some embodiments, the first vapor-phase halide reactant comprises fluorosulfonic acid, trifluoromethanesulfonic acid, trifluoromethyl trifluoromethanesulfonate, or 1-chloro 2-(pentafluorosulfuranyloxy)ethane.

In some embodiments, the first vapor-phase reactant comprises chlorosulfonyl isocyanate or N,N-dimethylsulfamoyl chloride.

In some embodiments the first vapor-phase reactant comprises boron, hydrogen and a halide. In some embodiments, the second vapor-phase halide reactant comprises phosphorous, oxygen, and a halide. In some embodiments, the first vapor-phase halide reactant comprises antimony and a halide.

In some embodiments, the first vapor-phase halide reactant comprises one or more $CF_3$ groups.

In some embodiments a first vapor-phase halide reactant may comprise a cyclic compound like cyclohexanedienes (chd), cyclopentadiene etc. In some embodiments first reactant may comprise of $\alpha,\beta$-unsaturated carbonyl compounds, for example enones like methyl vinyl ketone etc.

In some embodiments, the second vapor-phase reactant comprises a Lewis base. In some embodiments, the Lewis base comprises a pyridine, tetra-hydro furan (thf), DMSO, tetra-hydro-thiophene, a pyrrole, an imidazole, a thiazine, or an azines such as pyrazine. In some embodiments, the second vapor-phase reactant comprises a diamine or dithione. In some embodiments, the second vapor-phase reactant comprises a heterocyclic reactive compound. In some embodiments, the heterocyclic compound comprises a thiocarbonate, thiadiazole, or dioxane.

In some embodiments, the second vapor-phase reactant comprises a planar compound such as $BCl_3$, $BF_3$, or $AlCl_3$. In some embodiments the second vapor-phase reactant comprises a halide. In some embodiments, the second vapor-phase reactant comprises more than two halides.

In some embodiments, the second vapor-phase reactant comprises $SO_3$, an alkyl isothiocyanate such as $CH_3NCS$, chloronitrile, COS, or $CS_2$.

In some embodiments, second vapor-phase reactant is capable of forming coordinated bonds to a metal atom that has adsorbed to the substrate surface.

In some embodiments, the second vapor-phase reactant does not comprise metal. In some embodiments the second vapor-phase halide reactant is a carbon based halide. In some embodiments the carbon based halide comprises $CCl_4$ or $CBr_4$.

In some embodiments, the etching cycle comprises exposing the substrate to a first vapor-phase reactant and subsequently exposing the substrate to a second vapor-phase reactant, wherein the substrate is not contacted with a plasma reactant during the etching cycle. In some embodiments, the first vapor-phase reactant comprises $CSe_2$. In some embodiments, the first vapor-phase reactant comprises compounds with S=R=S structure in which R can be carbon or any hydrocarbon, such as C2-C8. In some embodiments, the first vapor-phase reactant comprises $CS_2$. In some embodiments, $CS_2$ takes part in in-situ formation of etchants. In some embodiments the second vapor-phase reactant comprises TEA or TMA.

In some embodiments a process for etching a thin film on a substrate in a reaction chamber comprises sequentially exposing the substrate to a vapor-phase halide reactant, wherein the vapor-phase halide reactant is not an alkylhalide comprising hydrogen, and wherein the process is not self-limiting.

In some embodiments the temperature of the substrate during the etching cycle is 300 to 500° C.

In some embodiments a method for etching a film on a substrate surface comprises exposing the substrate surface to a first vapor-phase halide reactant comprising a first halide ligand to form first reactant species on the substrate surface, wherein the first vapor-phase halide reactant does not comprise hydrogen. The substrate may be subsequently exposed to a second vapor-phase halide reactant comprising a second halide ligand such that the second vapor-phase halide reactant converts the first reactant species to vapor phase reaction products, wherein the second vapor-phase halide reactant does not comprise hydrogen. In some embodiments the formation of the first reactant species and/or the conversion of the second vapor-phase halide reactant to vapor phase reaction products are not self-limiting. In some embodiments the substrate is not exposed to a plasma reactant during the etching cycle. In some embodiments the substrate is exposed to a third vapor phase reactant that is different from the first and second vapor-phase reactants in one or more etch cycles.

DETAILED DESCRIPTION

Figure 1:
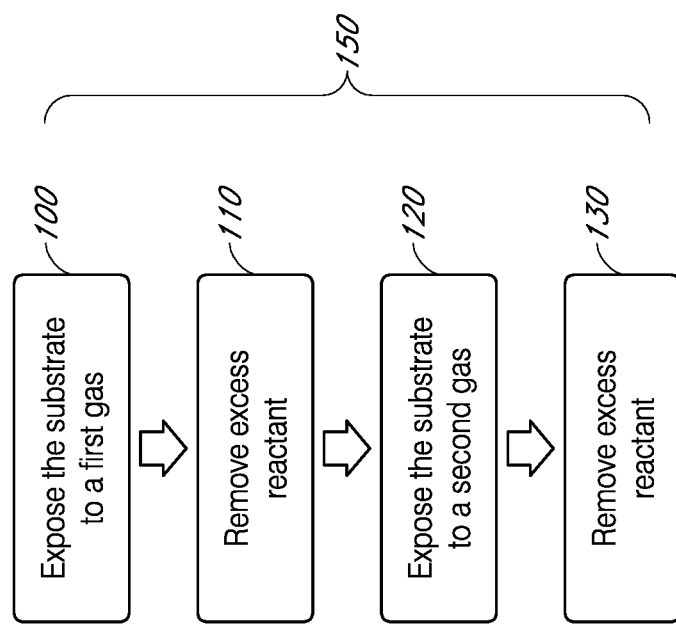
FIG. 1 is a flow chart generally illustrating a method for thermal atomic layer etching in accordance with some embodiments.

A sub-monolayer or more of material can be removed from a substrate by atomic layer etching (ALE) processes comprising alternately contacting the substrate surface in a reaction space with first and second vapor-phase reactants. In some embodiments of ALE-type processes, one or more etch cycles are provided comprising a saturative, self-limiting adsorption step in which the substrate is contacted with a first vapor-phase reactant followed by a second exposure step in which the substrate is contacted with a second vapor-phase reactant. In the first adsorption step the first reactant adsorbs, typically in a self-limiting manner, to the material to be etched on the substrate surface. The second exposure step then leads to the formation of volatile by-products that contain the adsorbate atoms, atoms of the second reactant and some atoms from the surface being etched. In this way the etching of the desired material on the substrate surface can be carefully controlled. In some embodiments the second reactant forms volatile adducts that include atoms from the surface being etched.

An adduct can be considered, for example, as a chemical species AB, each chemical or molecular entity of which is formed by direct combination of two separate chemical or molecular entities A and B in a way that there is change in the way the chemical or molecular entities connect, but no loss of atoms within the chemical entities A and B.

In some embodiments surface contaminations may be removed from a substrate surface, such as B or C contamination. In this context contaminations can be any unwanted atoms on the surface or film, for example metal contaminants, S, O etc. In some embodiments contaminations may be removed from a substrate surface or from the film itself during deposition step by additional selective etching step added every nth cycle of deposition cycles.

In some embodiments, the target material to be etched comprises a metal, such as Ti, Ta, Al, Zr or Hf, W. In some embodiments, the material to be etched comprises one or more of W, TiN, $TiO_2$, TaN, SiN, SiOx, $AlO_x$, $AlO_2$, $Al_2O_3$, $ZrO_x$, $ZrO_2$, $WO_3$, AlN, $HfO_x$ and $HfO_2$. In some embodiments, the material to be etched comprises metal nitride or metal oxide or mixtures thereof. In some embodiments the material to be etched may comprise Si, Ge, a-C, graphene, polymers, $SiO_x$, metals, including Pt, Fe, Cu, Au, and Zn in addition to the metals provided above.

In some embodiments, gas phase reactions are avoided by feeding the reactants alternately and sequentially into the reaction chamber. Vapor phase reactants are separated from each other in the reaction chamber. In some embodiments this may be accomplished, for example by removing excess reactants and/or reaction by-products from the reaction chamber between reactant pulses. In some embodiments the reactants may be removed from proximity with the substrate surface with the aid of a purge gas and/or vacuum. In some embodiments excess reactants and/or reactant byproducts are removed from the reaction space by purging, for example with an inert gas. In some embodiments purging comprises exposing the substrate surface to a purge gas, such as an inert gas. Because of the separation of reactants and the self-limiting nature of the reactions, less than a monolayer of material is typically removed in each ALE etch cycle. However, in some embodiments more than one monolayer may be removed in each cycle. In some embodiments the reactions may not be self-limiting or saturating. In some embodiments, at least one of the phases, such as in exposure to a first vapor phase reactant, second vapor phase reactant or the reactants in the additional phases, the reaction, such as etching reactions, are not self-limiting or saturating. In some embodiments pulses of reactants may partially or completely overlap. For example, in some embodiments one reactant may flow continuously into the reaction space while one or more additional reactants are provided intermittently, at desired intervals.

The ALE methods disclosed herein are thermal etching processes, as opposed to plasma etching processes. Thus, plasma reactants are not used in the ALE etch cycles. While referred to as thermal ALE processes to differentiate processes that use plasma reactants, in some embodiments, the ALE reactions may have zero activation energy and therefore may not require any additional thermal energy. Thus the reactions may also be referred to as chemical etching processes herein. Thermal ALE methods can be more desirable in some situations than plasma ALE methods because thermal ALE methods can be less damaging to the underlying substrate. Also, thermal ALE methods allows for isotropic etching of non-line of sight (NLOS) features.

The ALE processes disclosed herein utilize particular reactants or combinations of reactants that have been found to allow for controlled etching in the absence of the use of plasma. In some embodiments, metal halides, such as transition metal halides, for example halides such as chlorides, fluorides, bromides or iodides of group 5 or 6 transition metal halides, are used as a first reactant and are contacted to the substrate in a first self-limiting adsorption step. The metal in the first reactant may be, for example, Nb, Ta, Mo, Sn, V, Re, Te, or W. In some embodiments, the metal halide first reactant is a metal chloride, such as $NbCl_5$, $SnCl_4$, $TaCl_5$, $MoCl_x$ where x is from about 3 to 5, or $WCl_x$ where x is from about 4 to 6. In some embodiments, the metal halide first reactant is a metal fluoride, such as $NbF_5$, $TaF_5$, $WF_6$, $VF_5$, $ReF_6$, $ReF_7$, or $MoF_6$. In some embodiments, a non-metal or semi-metal fluoride like $TeF_6$, $SbF_5$ or $AsF_5$ can be used as first reactant. In some embodiments, the metal halide may be a metal bromide or metal iodide, such as $SnBr_4$, $SnI_4$.

In some embodiments, the first reactant may comprise a halide that is not a metal halide.

In some embodiments, the first reactant may comprise an organic halide compound. For example, in some embodiments, the first reactant may comprise an alkyl halide compound. In some embodiments, the first reactant may comprise an aromatic, saturated, or unsaturated aliphatic alkyl halide compound comprising two or more carbon atoms. In some embodiments, the first reactant may comprise a substituted alkyl halide, for example in some embodiments, the first reactant may comprise tert-butyl chloride, 1,1-dichloroethane, 1,2-dichloroethane, or trichloroethane, trifluoroethanol, trifluoroisopropanol. In some embodiments, the first reactant may comprise an aromatic, saturated, or unsaturated aliphatic alkene halide compound. For example, in some embodiments, the first reactant may comprise a substituted vinyl halide, or an allyl halide.

In some embodiments, the first reactant may comprise organic oxyhalide. In some embodiments, the first reactant may comprise an acyl halide compound, such as an aromatic, saturated, or unsaturated aliphatic acyl halide compound, including di, and tri acyl halides. For example, in some embodiments, the first reactant may comprise fumaryl chloride, malonyl chloride, succinyl, or oxalyl halide. In some embodiments, the first reactant may comprise terephthaloyl chloride. In some embodiments, the first reactant may comprise 1,3,5-Benzenetricarbonyl trichloride.

In some embodiments, the first reactant may comprise a sulfonyl halide, such as an aromatic, saturated, or unsaturated aliphatic sulfonyl halide. In some embodiments, the first reactant may comprise, for example, ethanesulfonyl fluoride ($C_2H_5FO_2S$), methanesulfonyl chloride ($CH_3ClO_2S$), methanesulfonyl fluoride ($CH_3FO_2S$), phenylsulfonyl fluoride ($PhFO_2S$), pyridinesulfonyl fluoride ($C_5H_4FNO_2S$), thiophenesulfonyl fluoride ($C_4H_3FO_2S_2$), cyanomethanesulfonyl chloride ($C_2H_2ClNO_2S$), chloromethanesulfonyl chloride ($ClCH_2SO_2Cl$), or trifluoromethanesulfonyl chloride ($CF_3SO_2Cl$) etc. In some embodiments, the first reactant may comprise a sulfenyl halide compound or selenenyl halide compound. For example, in some embodiments, the first reactant may comprise trichloromethanesulfenyl chloride ($CCl_3SCl$), or chlorocarbonylsulfenyl chloride ($ClCOSCl$). In some embodiments, the first reactant may comprise a compound having the formula PhSeCl, wherein Ph is a phenyl group. In some embodiments, the first reactant may comprise a compound having the formula RSeX, wherein R is an alkyl ligand and X is a halide.

In some embodiments, the first reactant may comprise sulfur, carbon, and one or more halide atoms, such as thiophosgene ($CSCl_2$).

In some embodiments, the first reactant may comprise sulfur, phosphorous, and one or more halide atoms, such as thiophosphoryl chloride ($PSCl_3$) and thiophosphoryl fluoride ($PSF_3$).

In some embodiments, the first reactant may comprise phosphorous and one or more halide atoms.

In some embodiments, the first reactant may comprise sulfur, nitrogen and one or more halide atoms, such as thiazyl chloride, thiazyl fluoride, thiazyl trifluoride ($NSF_3$).

In some embodiments, the first reactant may comprise phosphorous, oxygen and one or more halide atoms, such as phosphoryl chloride ($POCl_3$).

In some embodiments, the first reactant may comprise a ligand, phosphorous, oxygen and one or more halides. In some embodiments the first reactant may have the general formula ligand-$POX_2$. Exemplary ligands include dialkyl amido (e.g. N,N-dimethylphosphoramic dichloride), phenyl (e.g. phenylphosphoryl dichloride) and alkyl (e.g. tert-butylphosphonyl dichloride and methylphosphonyl dichloride).

In some embodiments, the first reactant may comprise a ligand, phosphorus and one or more halides. In some embodiments the first reactant may have the general formula ligand-$PX_2$, wherein X is halide including not just chlorine and fluorine. For example, the first reactant may comprise dimethylphosphoramidous dichloride.

In some embodiments, the first reactant may comprise sulfur and carbon. In some embodiments, the first reactant may comprise an S=R=S structure in which R can be carbon or any hydrocarbon, such as C2-C8 hydrocarbon. For example, in some embodiments the first reactant may comprise carbon disulfide ($CS_2$) or carbon diselenide ($CSe_2$). In some embodiments the first reactant may form adducts with transition metals incorporated in the substrates.

In some embodiments, the first reactant may comprise a compound comprising oxygen and sulfur and a halide and hydrogen or a hydrocarbon group, such as alkyl group.

In some embodiments, the first reactant may comprise a sulfinyl halide, such as an aromatic or aliphatic or substituted aromatic or substituted aliphatic, saturated, or unsaturated sulfinyl halide. In some embodiments, the first reactant may comprise, for example, trichloromethanesulfinyl chloride, trifluoromethanesulfinyl fluoride, trifluoromethanesulfinyl chloride, tert-butylsulfinyl chloride.

In some embodiments, the first reactant may comprise a sulfonic acid halide compound such as an aromatic or aliphatic or substituted aromatic or substituted aliphatic, saturated, or unsaturated sulfonic acid halide. For example, in some embodiments, the first reactant may comprise fluorosulfonic acid ($FSO_3H$) and/or trifluoromethanesulfonic acid ($CF_3SO_3H$).

In some embodiments, the first reactant may comprise a sulfonate compound, such as an aromatic or aliphatic or substituted aromatic or substituted aliphatic, saturated, or unsaturated sulfonate halide. For example, in some embodiments, the first reactant may comprise trimethylsilyl trifluoromethanesulfonate ($C_4H_9F_3O_3SSi$) and trifluoromethyl trifluoromethanesulfonate ($CF_3SO_3CF_3$).

In some embodiments, the first reactant may comprise a substituted sulfur triflouride having the formula $A-SF_3$, wherein A can be dimethylsulfide, diethylsulfide, benzene, alkyl group, pyridine, thiophene, cyclopropane, or aminato groups including methylmethanaminato in trifluoro(N-methylmethanaminato)sulfur.

In some embodiments, the first reactant may comprise a sulfurane compound having the formula $X—O—SF_y$, wherein X is an alkyl ligand, an aromatic ligand or a halide and y is from 1 to 5. For example, in some embodiments, the reactant may comprise 1-chloro 2-(pentafluorosulfuranyloxy)ethane ($SF_5OC_2H_2Cl$).

In some embodiments, the first reactant may comprise sulfur, oxygen and a halide, such as chlorine or fluorine, and a hydrocarbon and may include cyclic alkyl group, for example a cyclopropyl group e.g. cyclopropylthionylchloride.

In some embodiments, the first reactant may comprise a reactant with general formula Ligand-$CCl_3$. In some embodiments, the first reactant may comprise nitrogen, a halide, carbon and oxygen. For example, the reactant may comprise trichloronitromethane ($CCl_3NO_2$) or trichloroacetyl isocyanate ($Cl_3CCONCO$).

In some embodiments, the first reactant may comprise hydrogen, halide, carbon and oxygen. In some embodiments, the first reactant may comprise, for example, an alkyl chloroformate such as ethyl chloroformate, methyl chloroformate, propyl chloroformate, chloromethyl chloroformate, or 2,2,2-trichloroethoxycarbonyl chloride.

In some embodiments, the first reactant may comprise nitrogen, hydrogen, halide, carbon and oxygen. In some embodiments, the first reactant may comprise, for example, trichloroacetamide or substituted trichloroacetamide (O-Allyl 2,2,2-trichloroacetimidate).

In some embodiments, the first reactant may comprise nitrogen, halide, and carbon. In some embodiments, the first reactant may comprise, for example, trichloroacetonitrile.

In some embodiments, the first reactant may comprise nitrogen, carbon, sulfur, a halide and oxygen.

In some embodiments, the first reactant may comprise carbon, sulfur, a halide, hydrogen and oxygen.

In some embodiments, the first reactant may comprise nitrogen, carbon, sulfur, a halide, hydrogen and oxygen. In some embodiments, the first reactant may comprise chlorosulfonyl isocyanate, chloromethyl chlorosulfate, or N,N-dimethylsulfamoyl chloride.

In some embodiments, the first reactant may comprise a halogen and succinimide group. In some embodiments, for example, the first reactant may comprise N-Chlorosuccinimide, N-Bromosuccinimide.

In some embodiments, the first reactant may comprise boron, a halide and hydrogen. In some embodiments, the first reactant may comprise boron, fluorine and hydrogen. In some embodiments, the first reactant may comprise $HBF_4$, for example. In some embodiments $HBF_4$ is used as a complex compound, when the first reactant is not in vaporized form in the reactant source vessel.

In some embodiments, the first reactant may comprise a boron trihalide in a stabilizer, wherein the stabilizer may be, for example and without limitation, alkylamine, alkylnitrile, water, or dimethylsulfide, or other compound that may form either volatile complexes or adducts with boron trihalides. In some embodiments, the first reactant may comprise, for example, a boron trifluoride ethylamine complex.

In some embodiments, the first reactant may comprise a boron halide of general formulae $BX_aY_b$, wherein 'a' and 'b' can be greater than or equal to zero, or greater than or equal to one, and wherein X and Y can be halide, including fluorine, chlorine and bromine and iodine. The first reactant may be stabilized in an organic stabilizer containing at least one carbon, oxygen or hydrogen, including, for example, ethanol, diethyl ether, dimethyl ether, dimethylsulfide.

In some embodiments, the first reactant may comprise a tetrafluoroboric acid diethyl ether complex. In some embodiments, the first reactant may comprise, for example, trifluoride dihydrate. In some embodiments, the first reactant may comprise, for example, Boron trifluoride tetrahydrofuran complex.

In some embodiments, the first reactant flows continuously during the etch cycles or in a cyclic fashion into the reactor.

In some embodiments, the first reactant may comprise antimony and a halide, such as fluorine. In some embodiments, the first reactant may comprise antimony, fluorine and hydrogen. In some embodiments, the first reactant may comprise antimony, fluorine, oxygen and nitrogen. In some embodiments, the first reactant may comprise antimony, fluorine and oxygen. In some embodiments, the first reactant may comprise antimony, fluorine and at least one ligand other than antimony or fluorine. In some embodiments, the first reactant may comprise a fluoroantimonic salt compound. For example, in some embodiments, the first reactant may comprise hexafluoro antimonic acid ($HSbF_6$), nitronium hexafluoroantimonate $NO_2SbF_6$, nitrosonium hexafluoroantimonate ($NOSbF_6$), or hexafluoroantimonic acid hydrate ($HSbF_6 \cdot 6H_2O$).

In some embodiments, the first reactant may comprise phosphorus and oxygen. In some embodiments, the first reactant may comprise phosphorus, oxygen and hydrogen. In some embodiments, the first reactant may comprise phosphorus, oxygen and a halide such as fluorine. In some embodiments, the first reactant may comprise phosphorus, oxygen and a hydrocarbon group, such as an alkyl group. In some embodiments, the first reactant may comprise a phosphate compound. For example, in some embodiments, the first reactant may comprise ammonium hexafluorophosphate.

In some embodiments, the first reactant may comprise a compound having 4 or more halides, 5 or more halides, or 6 or more halides, wherein the halides can be, but are not limited to, chlorine and/or fluorine. In some embodiments, the first reactant may comprise a —$CF_3$ group. In some embodiments, the first reactant may comprise a —$CF_3$ group that may assist in selective etching. In some embodiments, the first reactant may comprise a —$CF_3$ group and sulfur. In some embodiments, the first reactant may comprise a —$CF_3$ group, nitrogen and oxygen. In some embodiments, the first reactant may comprise a —$CF_3$ group, carbon, hydrogen and oxygen, for example chlorodifluoroacetic acid. In some embodiments, the first reactant may comprise a —$CF_3$ group and a —$NH_2$ group. In some embodiments, the first reactant may comprise a —$CF_3$ group, a —$NH_2$ group and either oxygen or sulfur.

In some embodiments, the first reactant may comprise a —$CF_3$ group, oxygen and nitrogen, and may be connected via hydrocarbon chain, such as an alkyl chain. In some embodiments, the first reactant may comprise 1 or more $CX_aY_b$— groups, wherein X and Y are halides and can be, but are not limited to, fluorine and/or chlorine. In some embodiments, the first reactant may also comprise carbon, hydrogen and oxygen, for example chlorodifluoroacetic anhydride. In some embodiments, the first reactant may comprise HCl or HF, for example as a stabilizer, when the first reactant is not in vaporized form in the reactant source vessel. In some embodiments, the first reactant may comprise HCl, which is supplied separately to the reaction chamber.

In some embodiments, the first reactant may comprise carbon and a halogen. In some embodiments, the first reactant may comprise a compound of formula $CX_aY_b$, wherein a and b can be greater than or equal to one, for example, in some embodiments, a first reactant may comprise $CCl_3Br$, $CCl_2Br_2$. In some embodiments, the first reactant may comprise a compound of formula $CHX_aY_b$, wherein a and b can be greater than or equal to one, for example in some embodiments, a first reactant may comprise $CHCl_2Br$, $CHCl_3$, $CHCl_2Br$ or $CHClBr_2$.

In some embodiments, the first reactant may comprise a compound of formula $MO_cX_aY_b$, wherein c can be greater than zero, and a and, or b can be greater than or equal to one and can be greater than equal to zero, and M can be any transition metal. For example in some embodiments, M can be Rhenium, Niobium, tungsten, Titanium, vanadium, chromium, and wherein X and Y can be halide different from each other or X and Y can same halide. In some embodiments, the first reactant may comprise a compound of formula $MoOF_4$, $ReOF_4$, $WOF_4$, $ReOF_5$, $ReO_2F_2$, $ReO_2Cl_3$, $NbOF_3$.

In some embodiments, the first reactant may comprise an electronegative element, such as a halide such as fluorine or chlorine, close to the or adjacent to the atom through which the reactant bonds to the surface. For example, in some embodiments, the first reactant may comprise hexafluoroacetylacetone (Hhfac) in which fluorine is close to the C=O group through which the hfac bonds to the surface.

In some embodiments, the first reactant may comprise a halo-halogen compound having the general formula $X_aY_b$, wherein X and Y can be chlorine or fluorine or bromine or iodine, a and b are the stoichiometric coefficients, where each of a and b can be greater than or equal to 1. In some embodiments, the first reactant may comprise ClF, BrCl, $ClF_3$, $BrF_3$, $ClF_5$, $BrF_5$, $IF_5$, $IF_7$, $ICl_3$, $ICl_5$ or ICl. In some embodiments, the first reactant may comprise a halogen and oxygen. In some embodiments, the first reactant may comprise an oxyhalide having general formulae $O_bX_a$ or $O_bX_aY_c$. In some embodiments, the first reactant may comprise more than one halogen and more than one oxygen. In some embodiments, the first reactant may comprise $OF_2$, $FClO_2$, or $FClO_3$.

In some embodiments, the first reactant may comprise halogen, nitrogen and sulfur. In some embodiments, the first reactant may comprise, for example, thiazyl chloride (NSCl). In some embodiments, the first reactant may comprise a halogen, nitrogen, oxygen and sulfur. In some embodiments, the first reactant may comprise, for example, NSOCl.

In some embodiments, the first reactant may comprise a halogen, phosphorous and oxygen. In some embodiments, the first reactant may comprise, for example, $POCl_3$.

In some embodiments, the first reactant may comprise a substituted alkyl ammonium hydroxide compound, or an alkyl amine compound. In some embodiments an alkyl ammonium halide or hydroxide compound is formed on the surface. For example, in some embodiments, the first reactant may comprise or form on the surface such as tetramethylammonium hydroxide, or tetramethylamine. In some embodiments, the first reactant may comprise a secondary or tertiary alkylamine.

In some embodiments, the first reactant may comprise a boron halide compound comprising an organic ligand. For example, in some embodiments, the first reactant may comprise a compound having the formula $BX_nL_{3-n}$, wherein L is an organic ligand, such as an acetylacetonato (acac) ligand, X is a halide, and n is 1 or 2. In some embodiments, the first reactant may comprise $BF_2acac$.

In some embodiments, the first reactant may comprise carbon, hydrogen, and, or tin. For example in some embodiments, a first reactant may be comprise of a hexamethylditin. In some embodiments, the first reactant may comprise carbon, hydrogen, halide and tin. For example in some embodiments, a first reactant may be comprise of a trimethyltinbromide.

In some embodiments the first vapor-phase reactant comprises a first halide ligand and the second vapor-phase reactant comprises a second halide ligand. In some embodiments both the first and second vapor phase reactants comprise Cl. In some embodiments the second halide ligand is different from the first halide ligand.

In some embodiments the first vapor-phase halide reactant may be inorganic. In some embodiments the first vapor-phase halide reactant does not comprise carbon or both C and H. In some embodiments the second vapor-phase reactant may be inorganic. In some embodiments the second vapor-phase reactant may not comprise carbon or both C and H.

In some embodiments the first vapor phase reactant and second vapor phase reactant comprise the same number of halide ligands. In some embodiments the first vapor phase reactant and the second vapor phase reactant comprise a different number of halides. In some embodiments the first vapor phase reactant comprises one, two, three, four, five or six halides, while the second vapor phase reactant separately comprises one, two, three, four, five or six halides.

In some embodiments the first and second vapor phase reactants both comprise the same halides. In some embodiments the first and second vapor phase reactants comprise different halides.

In some embodiments the first vapor-phase halide reactant comprises one, two, three, four, five or six halides, which may all be the same halide, or may differ, and the second vapor-phase reactant comprises a different number of halides from the first reactant. The halides in the second reactant may be the same as or different from the halides in the first reactant. In some embodiments the second vapor-phase reactant may be selected from the reactants described herein; that is, in some embodiments two (or more) different reactants referred to as 'first vapor-phase reactants' can be used in a deposition cycle as first and second reactants.

In some embodiments the first vapor-phase halide reactant comprises from two to six halides (or halogen atoms), for example chlorides or fluorides, while the second vapor-phase reactant comprises two to six halides (or halogen atoms). In some embodiments the first vapor-phase halide reactant comprises from three to five halides (or halogen atoms), for example chlorides or fluorides, while the second vapor-phase reactant comprises three to five halides (or halogen atoms). The halides in the second vapor phase reactant may be the same as or different from the halides in the first vapor phase reactant.

In some embodiments both the first and second vapor-phase halide reactants comprise from four to five halides (or halogen atoms), for example chlorides or fluorides. The halides in the second vapor phase reactant may be the same as or different from the halide in the first vapor phase reactant.

In some embodiments the first vapor-phase halide reactant is a fluorinating or chlorinating agent while the second vapor phase reactant is a chlorinating or fluorinating agent. In some embodiments the first vapor phase halide reactant is a fluorinating agent while the second vapor phase reactant is a chlorinating agent. In some embodiments the first vapor phase reactant is a chlorinating agent while the second vapor phase reactant is a fluorinating agent.

In some embodiments the first vapor-phase halide reactant comprises more than one, such as two or more, three or more, four or more or five or more halides (or halogen atoms), for example chlorides or fluorides, while the second vapor-phase reactant comprises less than five, less than four, less than three or less than two halides (or halogen atoms). The halides in the second vapor phase reactant may be the same as or different from the halides in the first vapor phase reactant.

In some embodiments the first vapor-phase halide reactant comprises from four to five halides (or halogen atoms), for example chlorides or fluorides, while the second vapor-phase reactant comprises less than five, less than four, less than three or less than two halides (or halogen atoms). The halides in the second vapor phase reactant may be the same as or different from the halides in the first vapor phase reactant.

In some embodiments the second vapor-phase halide reactant comprises more than one, such as two or more, three or more, four or more or five or more halides (or halogen atoms), for example chlorides or fluorides, while the first vapor-phase reactant comprises less than five, less than four, less than three or less than two halides (or halogen atoms). The halides in the second vapor phase reactant may be the same as or different from the halides in the first vapor phase reactant.

In some embodiments the second vapor-phase halide reactant comprises from four to five halides (or halogen atoms), for example chlorides or fluorides, while the first vapor-phase reactant comprises less than five, less than four, less than three or less than two halides (or halogen atoms). The halides in the second vapor phase reactant may be the same as or different from the halide in the first vapor phase reactant.

In some embodiments, the first non-metal halide reactant is a non-metal halide reactant with the formula Ligand-$SX_2$ as well as Ligand-$SX_3$, where X is a halide and S can be sulfur and phosphor, Ligand can be dialkylether like dimethylether, dialkylthioether like di-methylthioether, alkylamines like dimethylamine, benzene, alkyl, pyridine, thiophene, cyclopropane and n-haloiminosulfur etc. In some embodiments, the first vapor-phase non-metal halide reactant can be trifluoro(N-methylmethanaminato)sulfur. In some embodiments, the first vapor-phase non-metal halide reactant is a N-Fluoroformyliminosulfur Difluoride ($SF_2$=NCOF).

In some embodiments, a halide reactant, such as fluoride, chloride, bromide or iodide is used as the second reactant that reacts with the adsorbed species to form volatile reaction products that can be removed from the reaction space. In some embodiments, the second reactant is a non-metal or semi-metal halide. For example, in some embodiments, the second reactant is carbon based halide. In some embodiments, the second reactant may comprise, for example, carbon based fluoride, bromide, iodide or chloride, for example, $CCl_4$ or $CBr_4$. In some embodiments, the second reactant is a semimetal based halide, such as a Ge halide, for example a semimetal chloride, like $SbCl_3$, $SbCl_5$, $SiCl_4$, or $GeCl_4$. In some embodiments, any of the reactants described above with reference to the first reactant may be used as the second reactant along with any of the above-described first reactants. That is, any two of the above-described first reactants may be used as a first reactant and a second reactant. For simplicity reasons, carbon based halide, including $CCl_4$, is considered to be organic or alkylhalide.

In some embodiments, the second reactant may comprise a compound capable of forming volatile adducts on a surface or substrate that has been contacted with a first reactant as described herein. The second reactant forms volatile adducts with the species formed on the substrate surface by the first reactant, and the adducts include one or more atoms from the surface to be etched. The volatile adducts may then be removed from the reaction space. For example, in some embodiments, the second reactant may comprise a compound capable of forming a volatile adduct on a contact with surfaces such as —OH, —SH, —$NH_2$, =NH terminated as well as halidized surface, such as a chlorinated high-k surface, or on an oxidized surface, or an amine coordinated surface.

In some embodiments, the second reactant may comprise a compound capable of forming a metal halide adducted compound on a surface that has been contacted with a first reactant as described herein.

In some embodiments, the second reactant may comprise a compound capable of forming coordinated bonds to a metal atom that has adsorbed to the substrate surface. For example, diamines, dithiones, thiocarbonates, thiadiazoles can form coordinated bonds to the metal atoms on the surface.

In some embodiments, the second reactant may comprise a Lewis base that will form volatile adducts on reaction with metals on the surface to be etched, such as transition metals. For example, in some embodiments, the second reactant may comprise pyridine, tetrahydrofuran (THF), dimethyl sulfoxide (DMSO), tetrahydrothiophene, or other Lewis bases which may form volatile adducts on the surface. In some embodiments, Lewis bases include alkyl or aryl or substituted nitriles (cyanates) and isonitriles like methyl nitrile, methyl isonitrile, $NH_3$ gas, alkyl or substituted isothiocyanates, isocyanates, poly-ols (such as propane 1,2,3 ols), ethanolamine, sulfones (such as methylsulfonylmethane), $PX_3$ and trichloronitromethane.

In some embodiments where the material being etched comprises a metal nitride, such as TiN or TaN, the second reactant may comprise a Lewis acid. In some embodiments, the Lewis acid is $SO_3$. In some embodiments, the second reactant may comprise planar compounds such as $BCl_3$, $BF_3$, or $AlCl_3$, a compound having a conjugated electron system, or a hypervalent molecule that will form adducts on the surface to be etched.

In some embodiments, the second reactant may comprise a diamine or dithione compound that will form adducts on the surface to be etched.

In some embodiments, the second reactant may comprise an alkyl or aryl isocyanates, or their substituted forms that can also form adducts on substrate surfaces to be etched, such as surfaces comprising transition metals. In some embodiments, the second reactant may comprise an alkyl or aryl isothiocyanate, or their substituted form.

In some embodiments, the volatile adduct forming second reactant may comprise alkyl or aryl poly-ols, for example 1,2,3, propane triol and ethane diol etc.

In some embodiments, adduct forming second reactant may comprise —$NH_2$ and —OH functional groups, for example ethanolamine.

In some embodiments, adduct forming second reactant may comprise sulfur trioxide ($SO_3$), In some embodiments second reactant may comprise sulfones like, for example, methylsulfonylmethane, which can assist in forming volatile adducts.

In some embodiments, the second reactant may comprise a heterocyclic reactive compound. In some embodiments, the second reactant may comprise a heterocyclic reactive compound containing more than equal to one Nitrogen atoms. In some embodiments, the second reactant may comprise a heterocyclic reactive compound containing more than equal to one Sulfur atoms. In some embodiments, the second reactant may comprise a heterocyclic reactive compound containing more than equal to one Oxygen atoms. In some embodiments, the second reactant may comprise a heterocyclic reactive compound containing more than two different atoms such as Oxygen, Boron, Nitrogen and Sulfur atoms. For example, in some embodiments, the second reactant may comprise a thiocarbonate compound, such as ethylene trithiocarbonate or dimethyl trithiocarbonate. In some embodiments, the second reactant may comprise a thiadizole compound, such as dicholor-thiadiazole, for example 3,4 dichloro-1,2,5 thiadiazole. In some embodiments, the second reactant may comprise a dioxane compound, such as 1,4-dioxane. In some embodiments, the second reactant may comprise a substituted or unsubstituted unsaturated cyclic compound comprising cyclohexadiene, cyclopentadine, such as trans-tris(trimethylsilyl)cyclohexadiene and bis(trimethylsilyl)cyclohexadiene.

In some embodiments, the second reactant may comprise a compound capable of forming an atrane compound when contacting a surface that has been exposed to a first reactant as described herein. For example, in some embodiments, the second reactant may comprise TIPA, TIPEA, TMEA, tris (2-aminoethyl)amine or triethanolamine (TEA), which may form volatile adducts such as metal atrane compounds when contacting a surface that has been exposed to a first reactant, such as a first metal halide reactant, as described herein.

In some embodiments, a metal film, such as a transition metal film is etched by an ALE process comprising exposing the substrate to a first halide reactant, such as a metal halide like $NbCl_5$, and a second volatile adduct-forming reactant, such as $CS_2$. In some embodiments, $CS_2$ can be used on a halidized surface such as $HfCl_x$, $TiCl_x$, or $TiONCl_x$ to form volatile products The substrate surface to be etched is alternately contacted with the first reactant and second reactant and volatile adducts and reaction byproducts are removed, thereby etching the transition metal film. In one embodiment TiN can be etched by an ALE process comprising alternately exposing the substrate to chlorine containing compound such as $NbCl_5$ and adduct forming compound such as $CS_2$.

In some embodiments a metal surface such as an Fe, Co, Ni, or Cu surface is halidized by exposure to a first halide reactant. The surface is then exposed to a second reactant that forms a volatile metal adduct and thereby etches the surface.

In some embodiments a metal oxide film on a substrate is etched by an ALE process comprising an etch cycle in which the metal oxide film is alternately exposed to a first halide reactant, such as a metal halide or $CCl_4$ and a second volatile adduct forming reactant, such as $CH_3CN$, $NH_3$ or 1,4-dioxane. In some embodiments $Al_2O_3$, $HfO_2$, $TiO_2$ or other metal oxide film on a substrate surface is etched by alternate exposure to a first reactant comprising a metal halide or $CCl_4$ and a second reactant comprising 1,4-dioxane.

In some embodiments, the second reactant, such as $CCl_4$, can be used alone, without a first reactant and can provide the desired controlled etching with the desired etch selectivity.

In some embodiments, the first reactant or the second reactant can be used alone for the etching and can provide the desired controlled etching with the desired etch selectivity. Any by-products that are formed may be removed by purging and/or by pumping.

In some embodiments the first reactant alone can be used in cyclic pulsing fashion.

In some embodiments, a continuous flow of the first reactant with flow rate modification, or "pulsing" of flow rate, is used.

In some embodiments, the first and the second reactants can be used interchangeably for the desired controlled etching with the desired etch selectivity.

In some embodiments two or more compounds described herein as first reactants can be used in cyclic fashion in an atomic layer etching process. For example, in some embodiments, the first reactant is $NbF_5$ and the second reactant is fumaryl chloride or malonyl or any acyl halide.

In some embodiments, the first reactant is $NbF_5$ and the second reactant is $CCl_4$.

In some embodiments, the first reactant and the second reactant comprise the same halide ligand. For example, the first reactant may comprise a metal chloride, such as $NbCl_5$, $TaCl_5$, $MoCl_3$ or $WCl_2$ and the second reactant may also comprise Cl, such as $CCl_4$.

In some embodiments either or both of the first or second reactant comprises a halide and does not contain hydrogen, or comprises a halide and does not contain either oxygen or hydrogen. In some embodiments either the first or second reactant comprises a halide but does not contain hydrogen, or comprise a halide but not contain either oxygen or hydrogen. In some embodiments at least one of the first and second reactants is not $Sn(acac)_2$. In some embodiments at least one of the first and second reactants is not TMA. In some embodiments at least one of the first and second reactants is not HF gas. In some embodiments at least one of the first and second reactants is not HF-Pyridine. In some embodiments the first and second reactants are not HF and $Sn(acac)_2$. In some embodiments the first and second reactants are not HF and $SiCl_4$. In some embodiments, H is not used. In some embodiments, TMA is not used. In some embodiments $Sn(acac)_2$ is not used.

In some embodiments, one or more additional reactants may be utilized. In some embodiments, one or more reactants may be used to improve or tune selective etching. The additional reactants may be provided separately, or may be combined with one or more reactants, such as with the second reactant. In some embodiments, the additional reactant may be an oxygen source. For example, the additional reactants may comprise, for example, water, oxygen or ozone.

In some embodiments, water, oxygen and/or ozone is combined with the second reactant. The ratio of water, oxygen or ozone to the second reactant may be varied to tune the reaction, for example to tune the selectivity of the etch process or even to stop the etching by forming an etch-stop layer.

In some embodiments, the additional reactant may comprise $SO_3$, $H_2S$, $NH_3$, hydrazine, where a and b are greater than zero. In some embodiments, the additional reactant may be used in combination with other first and/or second reactants.

In some embodiments, an additional reactant may be a $N_2O$ gas. The additional reactant may be supplied additionally from a separate source.

In some embodiments, an etch cycle additionally comprises a phase in which the substrate is exposed to a ligand exchanger. In some embodiments, the ligand exchanger is selected from Hacac TMA, $Sn(acac)_2$. In some embodiments, the ligand exchanger may consists of vicinal ketone groups for example hexafluoro acetylacetonato (Hhfac), diacetyl, thd etc. In Some embodiments a ligand exchanger consists of M(thd)x compound, wherein M is metal like transition metals as well as alkaline earth metals and x can be greater than 1 and in some cases greater than 2. In some embodiments Metal 'M' can consists of at least one 'thd' and or at least one 'acac' or both, for example Mg(thd)(acac) etc.

As mentioned above, in some embodiments the ALE process is preferably a thermal process. Thus, in some embodiments a plasma reactant is not used as a first or second reactant. In some embodiments a plasma reactant is not used in the ALE process.

In some embodiments for controlled etching, one or more ALE cycles are carried out, with each cycle removing material from the desired substrate surface. In some embodiments, up to a monolayer of material is removed in each ALE cycle, where the mass removed per cycle is about a monolayer of volume, assuming density does not change. In some embodiments, more than a monolayer per cycle is removed. Each ALE cycle typically comprises at least two distinct phases. The contacting of the substrate surface and removal of a reactant from the substrate may be considered a phase.

In a first phase, a vapor phase first reactant contacts the substrate surface to be etched. In some embodiments, the first reactant forms no more than about one monolayer of adsorbed species. In particular, in some embodiments, the first reactant reacts with accessible substrate molecules of the material to be removed on the substrate surface to form the adsorbed species.

The first phase is self-limiting in some embodiments. In some instances it may be the case that limited availability of substrate surface molecules to react with the vapor phase first reactant species ensures that the reaction is essentially self-limiting. In addition, the formed reaction layer itself can introduce self-limiting behavior.

In some embodiments, excess first vapor phase reactant and any reaction byproducts are removed from the proximity of the substrate surface. The first vapor phase reactant and any reaction byproducts may be removed from proximity of the substrate surface with the aid of a purge gas and/or vacuum. In some embodiments, excess reactant and/or reactant byproducts are removed from the reaction space by purging, for example with an inert gas. In some embodiments, the substrate may be moved in order to facilitate removal of the reactant and/or reactant byproducts from the vicinity of the substrate, for example by moving the substrate to a different reaction chamber.

In a second phase, a second vapor phase halide reactant contacts the substrate and may convert adsorbed species to vapor phase reaction products. The reaction products include atoms of the original material, thus etching the material. In some embodiments, the second reactant comprises the same halide as the first reactant. In some embodiments, the second reactant does not comprise a reactive species. Excess second reactant and vapor phase reaction products are removed from the substrate surface, for example with the aid of vacuum and/or a purge gas. In some embodiments, excess second reactant and reaction byproducts are removed from the reaction space by purging, for example with an inert gas. In some embodiments, the substrate may be moved in order to facilitate removal of the reactant and/or reaction byproducts from the vicinity of the substrate, for example by moving the substrate to a different reaction chamber.

Additional phases may be added and phases may be removed as desired to adjust the etch rate and/or to influence one or more properties of the remaining film after etching film, such as tune the resistivity, for example decrease or increase the resistivity on post etching by factor or 1% or more than 5% or more than 20% or more than 50% or more than 100%, modify optical properties for example decrease or increase the optical parameters like (n,k) on post etching by factor or 1% or more than 5% or more than 20% or more than 50% or more than 100%, modify the film roughness for example decrease or increase the roughness on post etching by factor or 1% or more than 5% or more than 20% or more than 50% or more than 100%, and improve the selectivity of etching for example decrease or increase the selectivity on post etching by factor or 1% or more than 5% or more than 20% or more than 50% or more than 100%. In some embodiments, the second reactant, such as $CCl_4$, can be used alone, without a first reactant and can provide the desired controlled etching with the desired etch selectivity. In some embodiments, one or more additional reactants may be provided in a separate phase, such as an oxygen reactant like oxygen, water or ozone.

In some embodiments, a third phase is added by depositing a third vapor-phase reactant. The third phase may then be removed to adjust the etch rate and/or to influence the etched material. A fourth phase is added by depositing a fourth vapor-phase reactant. And additional phases are added by depositing additional vapor-phase reactants.

One or more of the reactants may be provided with the aid of a carrier gas, such as Ar or He. In some embodiments, the first reactant and the second reactant are provided with the aid of a carrier gas. In some embodiments, the carrier gas may flow continuously throughout the process. In some embodiments, the carrier gas may also serve as a purge gas.

The first and second phases together form an ALE etching cycle that controllably removes material from the substrate surface. The ALE etching cycle may be repeated two or more times to etch the material on the substrate surface to a desired degree. In some embodiments, the ALE etching cycle is repeated 10, 20, 50, 100, 200, 400, 600, 800, 1000 or more times to remove the desired amount of material.

In some embodiments, two of the phases may overlap, or be combined. For example, the first reactant and the second reactant may contact the substrate simultaneously in phases that partially or completely overlap. In addition, although referred to as the first and second phases, and the first and second reactants, the order of the phases may be varied, and an ALE cycle may begin with any one of the phases.

Due to the use of vapor phase reactants, the conformality of the etching process is very good, and material can be removed evenly from all surfaces of a three-dimensional structure. In some embodiments, the conformality of etching vertically is greater than about 90% and the conformality of etching horizontally is greater than about 92%. In some embodiments conformality of etching in vertical openings is about 50% or greater, about 75% or greater, about 85% or greater, about 90% or greater, about 95% or greater, about 98% or greater, about 99% or greater, and even up to about 100%. In some embodiments conformality of etching in openings extending horizontally (for example from vertical openings), is about 50% or greater, about 75% or greater, about 85% or greater, about 90% or greater, about 95% or greater, about 98% or greater, about 99% or greater, and even up to about 100%. In some embodiments, the process comprises more than two phase, more than three phases or more than four phases or more than five phases applied in cyclic manner.

In some embodiments, the substrate comprising a material to be etched, such as a semiconductor workpiece, is loaded into a reaction space or reactor. The reactor may be part of a cluster tool in which a variety of different processes in the formation of an integrated circuit are carried out. In some embodiments, a flow-type reactor is utilized. In some embodiments, a shower head type of reactor is utilized. In some embodiments, a space divided reactor is utilized. In some embodiments, a high-volume manufacturing-capable single wafer atomic layer deposition reactor is used. In other embodiments a batch reactor comprising multiple substrates is used.

Examples of suitable reactors that may be used include commercially available equipment such as the F-120® reactor, F-450® reactor, Pulsar® reactors—such as the Pulsar® 2000 and the Pulsar® 3000-EmerALD® reactor and Advance® 400 Series reactors, available from ASM America, Inc of Phoenix, Ariz. and ASM Europe B.V., Almere, Netherlands. Other commercially available reactors include those from ASM Japan K.K (Tokyo, Japan) under the tradename Eagle® XP and XP8. In some embodiments, the reactor is an etch reactor.

In some embodiments, if necessary, the exposed surfaces of the workpiece can be pretreated to provide reactive sites to react with the first phase of the ALE process. In some embodiments, a separate pretreatment step is not required. In some embodiments, the substrate is pretreated to provide a desired surface termination. In some embodiments, the substrate is pretreated with plasma.

The reactants, such as the first reactant and second reactant, are supplied to the reaction space in gaseous form. The first reactant and second reactant gas are considered "volatile" for purposes of the present description if the species exhibits sufficient vapor pressure under the process conditions to transport the species to the workpiece in sufficient concentration to saturate exposed surfaces.

In some embodiments, a reactant is pulsed into the reaction chamber containing the substrate with the surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In some embodiments, the pulse time may be greater than 60 seconds, for example up to 120 seconds or more. In some embodiments, the reactant contacts the substrate surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In some embodiments, the pulse time may be greater than 60 seconds, for example up to 120 seconds. The optimum time can be readily determined by the skilled artisan based on the particular circumstances.

As mentioned above, after sufficient time for about a molecular layer to react with the material to be removed on the substrate surface and form the adsorbed species, excess first reactant, and reaction byproducts, if any, are removed from the substrate surface. In some embodiments removing excess reactant and reaction byproducts, if any, may comprise purging the reaction chamber. In some embodiments, the reaction chamber may be purged by stopping the flow of the first reactant while continuing to flow a carrier gas or purge gas for a sufficient time to diffuse or purge excess reactants and reactant by-products, if any, from the reaction space. Reaction by-products may comprise, for example, oxyhalides. In some embodiments, the excess first reactant is purged with the aid of inert gas, such as helium or argon, which is flowing throughout the ALE cycle. In some embodiments, the substrate may be moved from the reaction space containing the first reactant to a second, different reaction space. In some embodiments, the first reactant is removed for about 0.01 to about 60 seconds, 0.05 to about 30 seconds, about 0.1 seconds to about 10 seconds, about 0.3 seconds to about 5 seconds or about 0.3 seconds to about 1 second. In some embodiments it may be 60 seconds or more.

In the second phase, the second reactant, such as $CCl_4$, is provided to the workpiece. Typically the second reactant is pulsed into the reaction chamber containing the substrate with the surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In some embodiments, the second reactant contacts the substrate surface to be etched for about 0.05 seconds to about 5.0 seconds, about 0.1 seconds to about 3 seconds or about 0.2 seconds to about 1.0 seconds. In some embodiments, the pulse may be greater than about 60 seconds. However, depending on the reactor type, material being etched and other process conditions, such as surface area and temperature, the second reactant contacting time may be even higher than about 10 seconds. In some embodiments, contacting times can be on the order of minutes. The optimum contacting time can be readily determined by the skilled artisan based on the particular circumstances.

The second reactant reacts with the adsorbed species to form vapor phase reaction by-products that include atoms of the material being etched. Excess second reactant and the vapor phase reaction by-products are removed from the reaction chamber. In some embodiments removing excess reactant and reaction byproducts may comprise purging the reaction chamber. In some embodiments, the reaction chamber may be purged by stopping the flow of the second reactant while continuing to flow a carrier gas or purge gas for a sufficient time to diffuse or purge excess reactants and reactant by-products, from the reaction space. In some embodiments, the excess second reactant and reaction by-products are purged with the aid of inert gas, such as helium or argon. In some embodiments, the substrate may be moved from the reaction space containing the second reactant to a different reaction space. The pulse of purge gas may, in some embodiments, be from about 0.1 seconds to about 10 seconds, about 0.1 seconds to about 4 seconds or about 0.1 seconds to about 0.5 seconds.

According to some embodiments, the ALE cycles may be performed at temperatures ranging from about 20 to about 1200° C., about 50 to about 800° C., about 75 to about 600° C., about 300° C. to about 500° C., or from about 350° C. to about 450° C. In some embodiments, the temperature is greater than about 20, 50 or 100° C., but less than about 1000, 800, 600 or 500° C. In some embodiments, the cycles are carried out at a temperature of about 450° C.

The pressure in the reaction chamber is typically from about 10E-9 torr to about 760 torr, or about 0.001 to about 100 torr. However, in some cases the pressure will be higher or lower than this range, as can be determined by the skilled artisan given the particular circumstances. In some cases the reactor can be operated either in isothermal (such as hot-wall) or non-isothermal (such as cold-wall) conditions. In some cases reactor does not interact with etching chemistries and may also not interact with substrates. In some cases reactor can be hot-wall, cold and even warm-wall type of reaction chamber.

The substrate comprising a material to be etched, also referred to as target material, can take a variety of forms. In some embodiments, the substrate may be an integrated circuit workpiece or other substrate. The target material to be etched may comprise a thin film on the substrate surface. In some embodiments, the target material is a thin film on a three-dimensional structure on a substrate. The substrate comprising a thin film or other material to be etched may comprise various types of other materials. For example, in some embodiments, the substrate may comprise silicon in addition to a material that is targeted by the etching process. In some embodiments, the etch process is selective relative to other materials on the substrate or in the reaction chamber. In some embodiments either first reactant alone, or second reactant alone, or first as well as second reactant is supplied in a cyclic fashion to improve the selectivity.

In some embodiments, the target material to be etched comprises a metal, such as Jr, Ru, Rh, Mo, Cu, Sb, Al, Ti, Co, Ni, Ta, Al, Zr, Hf, or W. In some embodiments, the material to be etched comprises one or more of W, $WO_3$, AlN, TiN, $TiO_2$, GaN, MoN, CoP, TaN, SiN, SiOx, $AlO_x$, $AlO_2$, $Al_2O_3$, $ZrO_x$, $ZrO_2$, and $HfO_x$, for example $HfO_2$. In some embodiments, the material to be etched comprises metal nitride or metal oxide or mixtures thereof.

In some embodiments, a thin film comprising one or more of W, TiN, $TiO_2$, TaN, SiN, SiOx, $AlO_x$, $AlO_2$, $Al_2O_3$, $ZrO_x$, $ZrO_2$, $WO_3$, AlN, $HfO_x$ and $HfO_2$ is etched by an ALE process comprising alternately and sequentially contacting a substrate comprising the thin film with $NbF_5$ and $CCl_4$. In some embodiments, a thin film comprising one or more of W, TiN, $TiO_2$, TaN, SiN, SiOx, $AlO_x$, $AlO_2$, $Al_2O_3$, $ZrO_x$, $ZrO_2$, $WO_3$, AlN, $HfO_x$ and $HfO_2$ is etched by an ALE process comprising alternately and sequentially contacting a substrate comprising the thin film with a first reactant and a second reactant, wherein the first reactant and the second reactant comprise the same halide.

In some embodiments, the ALE process has an average etch rate of about 0.01 to about 5 Å/cycle. Etch rate is defined as amount of material or thickness of film is removed after each cycle, for practical reasons it can be calculated after 1 etching cycles or more than 2 etching cycles or more than 5 or even higher than 20 or sometimes higher than 50 cycles. In some embodiments, the average etch rate is about 0.01 to 0.1 Å/cycle or from 0.1 to about 2 Å/cycle or in some cases even higher than 2 Å/cycle. In some embodiments, the average etch rate is more than about 0.1 Å/cycle, more than about 0.5 Å/cycle, more than about 1.0 Å/cycle, more than about 2.0 Å/cycle, more than about 3.0 Å/cycle, more than about 5.0 Å/cycle, more than about 10 Å/cycle or more than about 20 Å/cycle and in some instances if continuous flow is applied with flow rate modification or the exposure times are long enough the etch rates can be more than about 30 Å/cycle, more than about 50 Å/cycle or more than about 100 Å/cycle.

In some embodiments the etch selectivity i.e. the ratio of material (thickness, mass or amount of atoms/molecules) removed from the desired surface/material to material removed from the non-desired surface/materials or surfaces/materials, is from more than about 2:1, more than about 3:1, more than about 5:1, more than about 7:1, more than about 10:1, more than about 15:1, more than about 20:1, more than about 30:1, more than about 50:1, more than about 100:1, more than about 1000:1. In some embodiments no substantial amount of material is removed from the non-desired surface/material.

In some embodiments the flow or first or second reactant can be higher than 2 sccm, can be greater than 10 sccm or sometimes even higher than 50 sccm or can be more than 100 sccm or more than 500 sccm etc. In some embodiments first reactant can be continuously flown into the reaction chamber while second reactant is flown intermittently.

FIG. 1 is a flow chart that depicts an embodiment of an ALE method generally. The ALE method depicted in FIG. 1 comprises a first exposing step 100, a first removing step 110, a second exposing step 120, and a second removing step 130.

In some embodiments, a substrate having an etch target material is placed in a reaction chamber and exposed to a first vapor-phase reactant in the first exposing step 100. The etching target is typically exposed to the first vapor-phase reactant for a period of time as provided above. In some embodiments, the pulse time is about 0.1 to 10 seconds, or 0.1 to 5 seconds.

After the first exposing step 100, excess first vapor-phase reactant is removed from the reaction chamber in the first removing step 110. The reaction chamber may be evacuated with a vacuum pump and or/by replacing the gas inside the reactor with an inert gas such as argon or nitrogen. The removing step 110 may typically take about 0.05 to 20 seconds. However, the removing step may take more or less time if necessary.

The substrate is subsequently be exposed to a second vapor-phase reactant in the second exposing step 120. The second reactant may be the same as the first vapor-phase reactant. The etching target is typically exposed to the second vapor-phase reactant for a period of time as discussed above, for example about 0.1 seconds to 10 seconds.

After the second exposing step 120, excess second vapor-phase halide reactant and volatile reaction byproducts are removed from the reaction chamber in the second removing step 130. In some embodiments, the first exposing step 100, the first removing process 110, the second exposing step 120, and the second removing step 130 form an ALE etch cycle 150 that may be repeated until a desired amount of etching of the target material is obtained. In some embodiments, the first exposing step 100, the first removing process 110, the second exposing step 120, and the second removing step 130 may be repeated for 10, 20, 50, 100, 200, 500, 1000 or more cycles.

In some embodiments, the etch target material comprise of metals like W, Pt, Cu, Ni, Co, Ti, Zn, Nb, Mo, Ta etc. In some embodiments, the etch target material comprise of metal nitrides, for example MoN, NbN, SiN, TiN, TaN, WN, AlN etc. In some embodiments, the etch target material comprise of carbides like SiC, TiC, TaC, AlC, HfC, MoC, NbC etc. In some embodiments, the etch target material comprise of oxides, such as dielectric oxides, for example AlOx, ZrOx, HfOx, TiOx, TaOx, NbOx, MoOx, SiOx, LaOx etc. In some embodiments, the etch target material comprise of 2D materials and/or sulfides like WS2, MoS2, TiS2, SnS2 etc. In some embodiments, the etch target material comprise of metal oxy nitrides like TiONx, metal carbonitrides, such as WNC, oxycarbides e.g. and elemental substrates like Si, C, a-C, graphene etc.

In some embodiments, the first reactant comprises Nb, Ta, Mo or W.

Figure 2:
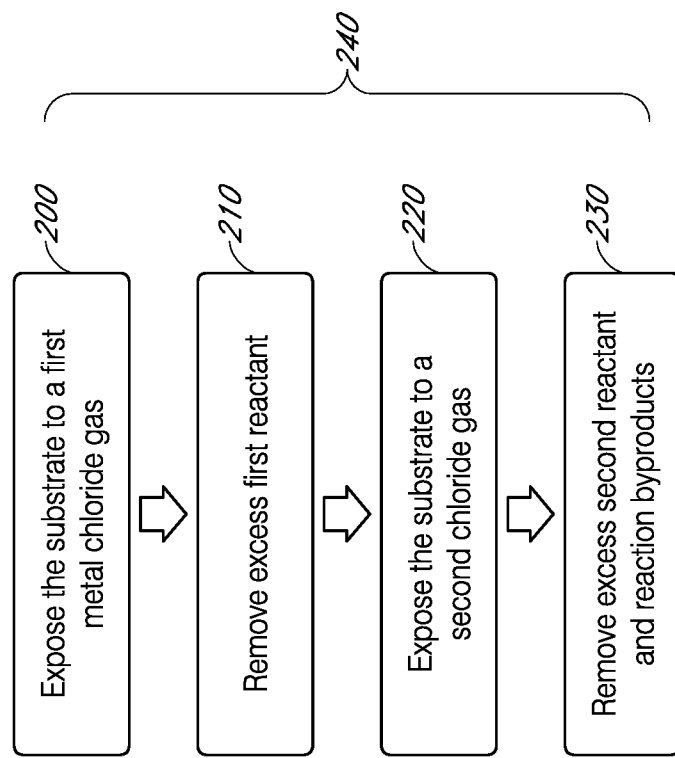
FIG. 2 is a flow chart generally illustrating a method for thermal atomic layer etching using chloride reactants in accordance with some embodiments.

Referring to FIG. 2, according to some embodiments an etch target thin film comprising W, TiN, $TiO_2$, TaN, SiN, SiOx, $AlO_x$, $AlO_2$, $Al_2O_3$, $ZrO_x$, $ZrO_2$, $WO_3$, AlN, $HfO_x$ or $HfO_2$ on a substrate in a reaction space is etched by an ALE process comprising at least one etch cycle 240 comprising: contacting the substrate with a vapor phase metal chloride reactant that does not comprise excited species at step 200 such that the metal chloride reactant reacts with the thin film on the surface of the substrate to form adsorbed species; removing excess metal chloride reactant and reaction byproducts, if any, from the substrate surface at step 210; contacting the substrate with a second chloride reactant that does not comprise reactive species at step 220 thereby converting the adsorbed species into vapor phase reaction by-products that include atoms of the etch target thin film; removing excess second chloride reactant and reaction byproducts, if any, from the substrate surface at step 230; and optionally repeating the contacting and removing steps at step 240 to etch the etch target thin film to a desired extent.

Figure 3:
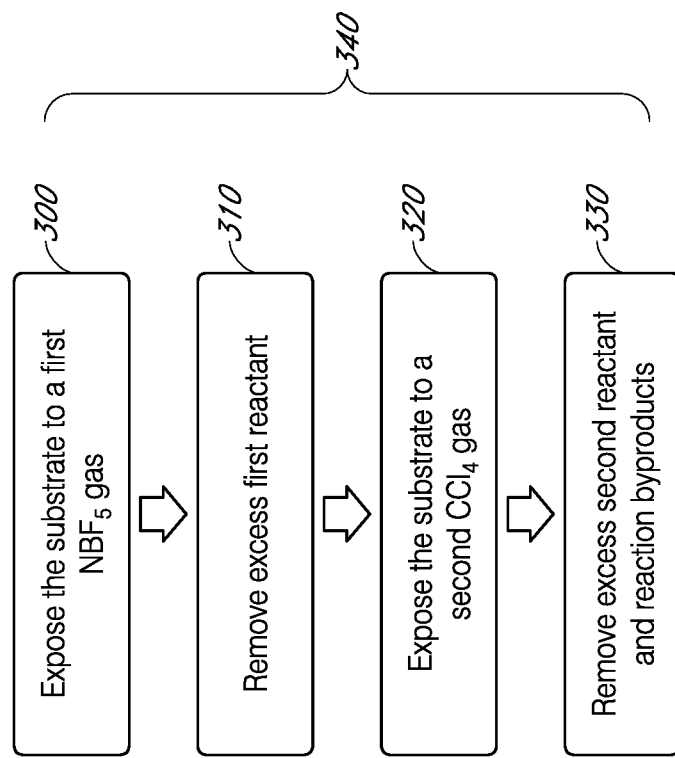
FIG. 3 is a flow chart generally illustrating a method for thermal atomic layer etching using $NbF_5$ and $CCl_4$ as reactants in accordance with some embodiments.

Referring to FIG. 3, according to some embodiments an etch target thin film comprising W, TiN, $TiO_2$, SiOC, SiCN, SiOCN, SiON, TaN, SiN, SiOx, $AlO_x$, $AlO_2$, $Al_2O_3$, $ZrO_x$, $ZrO_2$, $WO_3$, AlN, $HfO_x$ or $HfO_2$ on a substrate in a reaction space is etched by an ALE process comprising at least one etch cycle 340 comprising: contacting the substrate with vapor phase $NbF_5$ at step 300; removing excess $NbF_5$ and reaction byproducts, if any, from the substrate surface at step 310; contacting the substrate with vapor phase $CCl_4$ at step 320; removing excess $CCl_4$ and reaction byproducts from the substrate surface at step 330; and optionally repeating the contacting and removing steps at step 340 to etch the etch target thin film to a desired extent.

Figure 4:
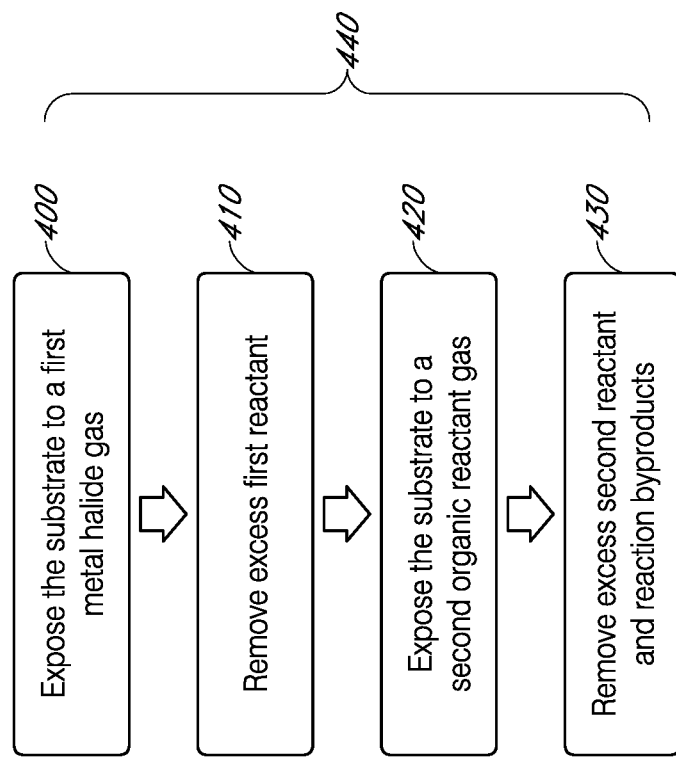
FIG. 4 is a flow chart generally illustrating a method for thermal atomic layer etching using a first halide reactant and a second organic reactant in accordance with some embodiments.

Referring to FIG. 4, according to some embodiments an etch target thin film comprising W, TiN, $TiO_2$, TaN, SiN, SiOx, $AlO_x$, $AlO_2$, $Al_2O_3$, $ZrO_x$, $ZrO_2$, $WO_3$, AlN, $HfO_x$ or $HfO_2$ on a substrate in a reaction space is etched by an ALE process comprising at least one etch cycle 440 comprising: contacting the substrate with a vapor phase metal halide reactant that does not comprise excited species at step 400 such that the metal halide reactant reacts with the thin film on the surface of the substrate to form adsorbed species; removing excess metal halide reactant and reaction byproducts, if any, from the substrate surface at step 410; contacting the substrate with a second organic reactant that does not comprise reactive species at step 420 thereby converting the adsorbed species into vapor phase reaction by-products that include atoms of the etch target thin film; removing excess second organic reactant and reaction byproducts, if any, from the substrate surface at step 430; and optionally repeating the contacting and removing steps at step 440 to etch the etch target thin film to a desired extent.

Figure 5:
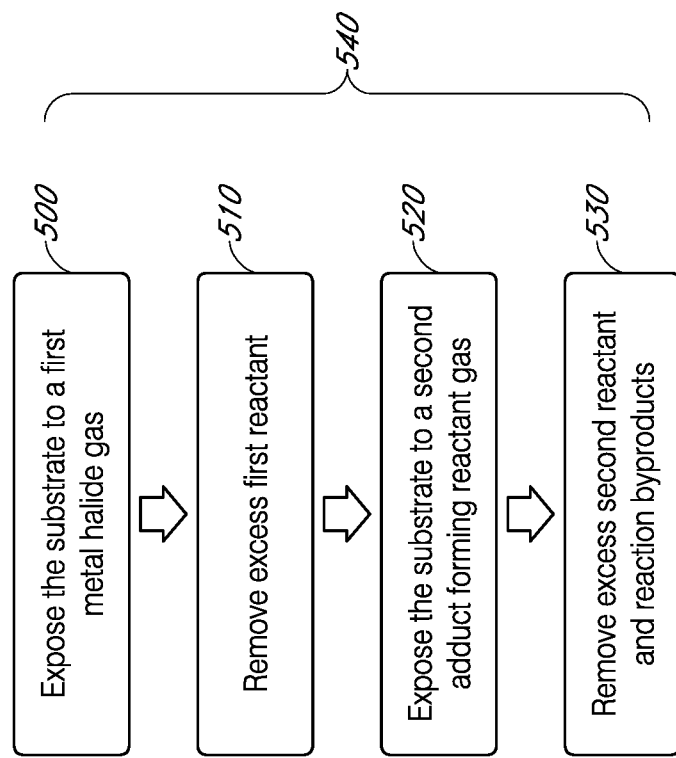
FIG. 5 is a flow chart generally illustrating a method for thermal atomic layer etching using a first halide reactant and a second adduct forming reactant in accordance with some embodiments.

Referring to FIG. 5, according to some embodiments an etch target thin film comprising W, TiN, $TiO_2$, TaN, SiN, SiOx, $AlO_x$, $AlO_2$, $Al_2O_3$, $ZrO_x$, $ZrO_2$, $WO_3$, AlN, $HfO_x$ or $HfO_2$ on a substrate in a reaction space is etched by an ALE process comprising at least one etch cycle 540 comprising: contacting the substrate with a vapor phase metal halide reactant that does not comprise excited species at step 500 such that the metal halide reactant reacts with the thin film on the surface of the substrate to form adsorbed species; removing excess metal halide reactant and reaction byproducts, if any, from the substrate surface at step 510; contacting the substrate with a second adduct forming reactant that does not comprise reactive species at step 520 thereby converting the adsorbed species into volatile adducts that include atoms of the etch target thin film; removing excess second adduct forming reactant and reaction byproducts, if any, from the substrate surface at step 530; and optionally repeating the contacting and removing steps at step 440 to etch the etch target thin film to a desired extent.

According to some embodiments an etch target thin film comprising $Al_2O_3$, $HfO_2$, $TiO_2$ or another metal oxides on a substrate in a reaction space is etched by an ALE process comprising at least one etch cycle comprising: contacting the substrate with a first vapor phase reactant comprising a metal halide or $CCl_4$ that does not comprise excited species such that the first reactant reacts with the thin film on the surface of the substrate to form adsorbed species; removing excess first reactant and reaction byproducts, if any, from the substrate surface; contacting the substrate with a second organic reactant comprising 1,4-dioxane that does not comprise reactive species thereby converting the adsorbed species into volatile adducts that include atoms of the etch target thin film; removing excess second organic reactant and reaction byproducts, if any, from the substrate surface; and optionally repeating the contacting and removing steps to etch the etch target thin film to a desired extent.

EXAMPLES

Thermal ALE was used to etch thin films of $SiO_2$ (thermal and native), TiN, $TiO_x$, TaN, $AlO_x$, AlN, $ZrO_x$ and $HfO_x$. The ALE cycle comprised alternate and sequentially contacting a substrate comprising the relevant film with $NbF_5$ and $CCl_4$; $NbF_5$ and a mixture of $CCl_4$ and $H_2O$; $NbF_5$ and a mixture of $CCl_4$ and O3; or $CCl_4$ alone. As shown in Table 1 below, etching of each of the various types of thin films was observed, with the etch rate ranging from about 0.1 Å/cycle to about 1.8 Å/cycle. No etching of $SiO_2$ films or $SiO_x$ or $SiN_x$ was observed.

TABLE 1

| Reactant 1 | Reactant 2 | $T_{reac.}$ °C. | Etch rate (Å/cycle) | | | | | | |
|---|---|---|---|---|---|---|---|---|---|
| | | | TiN | TiOx | TaN | AlOx | AlN | ZrOx | HfOx |
| $NbF_5$ | $CCl_4$ | 458 | ~0.2 | 1.8 | Yes (0.5) | 0.1-1.6 | Yes | 0.4 | 0.1-1.8 |
| $NbF_5$ | $CCl_4$ + $H_2O$ | 458 | Yes | Yes | Bulk rem. | Yes | Yes | Yes | Yes |

TABLE 1-continued

| Reactant 1 | Reactant 2 | $T_{reac}$ °C. | Etch rate (Å/cycle) | | | | | | |
|---|---|---|---|---|---|---|---|---|---|
| | | | TiN | TiOx | TaN | AlOx | AlN | ZrOx | HfOx |
| NbF$_5$ | CCl$_4$ | 458 | ~0.2 | 1.8 | Yes (0.5) | 0.1-1.6 | Yes | 0.4 | 0.1-1.8 |
| NbF$_5$ | CCl$_4$ + O$_3$ | 458 | Yes | Yes | Bulk rem. | Yes | Yes | Yes | Yes |
| | CCl$_4$ | 458 | 0.1 | — | 0.4 | No | — | No | No |

—Not tested

Figure 6:
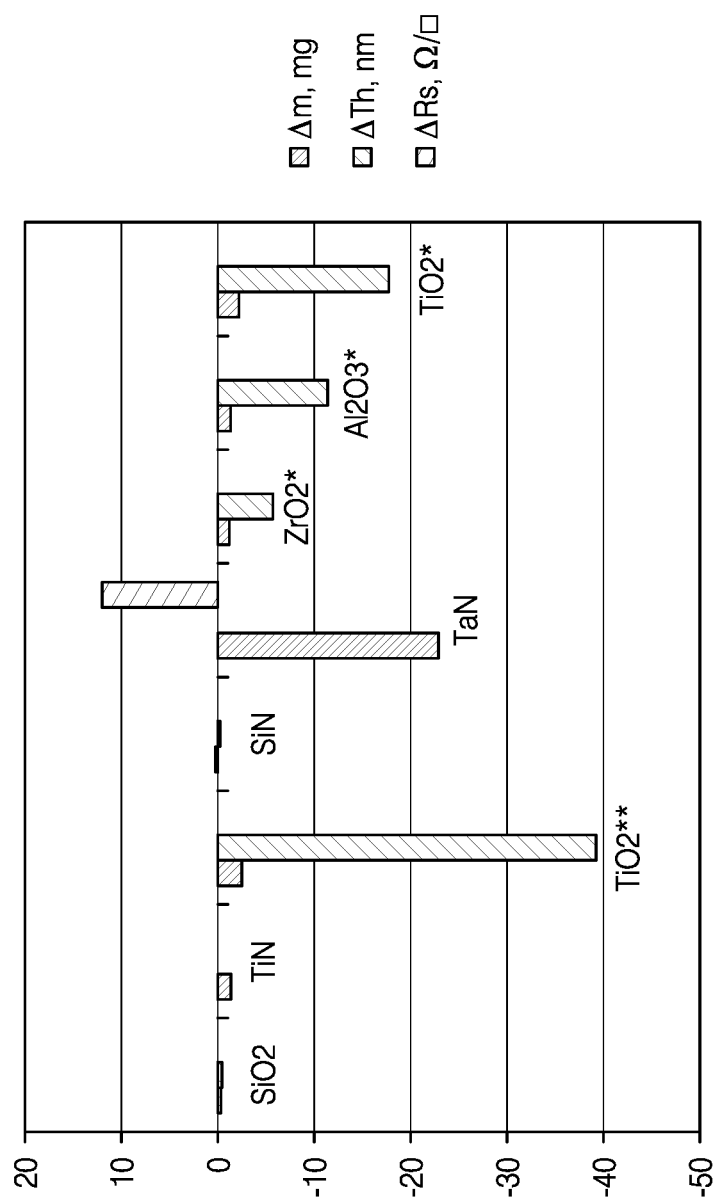
FIG. 6 is a graph showing the differences in mass, thickness, and sheet resistance of $SiO_2$, TiN, AlN, $TiO_2$, SiN, TaN, $ZrO_2$, and $Al_2O_3$ films after ALE processing using $NbF_5$ and $CCl_4$ as reactants.

FIG. 6 is a graph showing the differences of mass, thickness, and sheet resistance of SiO$_2$, TiN, TiO$_2$, SiN, TaN, ZrO$_2$, and Al$_2$O$_3$ after thermal ALE processing. Substrates comprising thin films of each material were placed in a Pulsar 2000™ reactant. The thermal ALE cycle comprised alternate and sequential pulses of NbF$_5$ and CCl$_4$. The substrate temperature was about 450° C. (susceptor temperature of 465° C. and top plate temperature of 405° C.). Mass, thickness and sheet resistance were measured after 1000 ALE cycles for the SiO$_2$, Tin, TiO$_2$, SiN, and TaN films and after 100 cycles for ZrO$_2$, Al$_2$O$_3$ and TiO$_2$ films. Noticeable changes were observed for TiN, TiO$_2$, TaN, ZrO$_2$, and Al$_2$O$_3$ from the graph. With regards to TiO$_2$, after 1000 etch cycles the thickness of the film decreased about 40 nm, consuming the entire layer. After 100 cycles the thickness decreased about 20 nm. With regards to TaN, the mass decreased about 22 mg and the sheet resistant increased about 11Ω/□ after 1000 cycles. With regards to ZrO$_2$, the thickness decreased about 5 nm after 100 cycles. With regards to Al$_2$O$_3$, the thickness decreased about 11 nm after 100 cycles.

Figure 7:
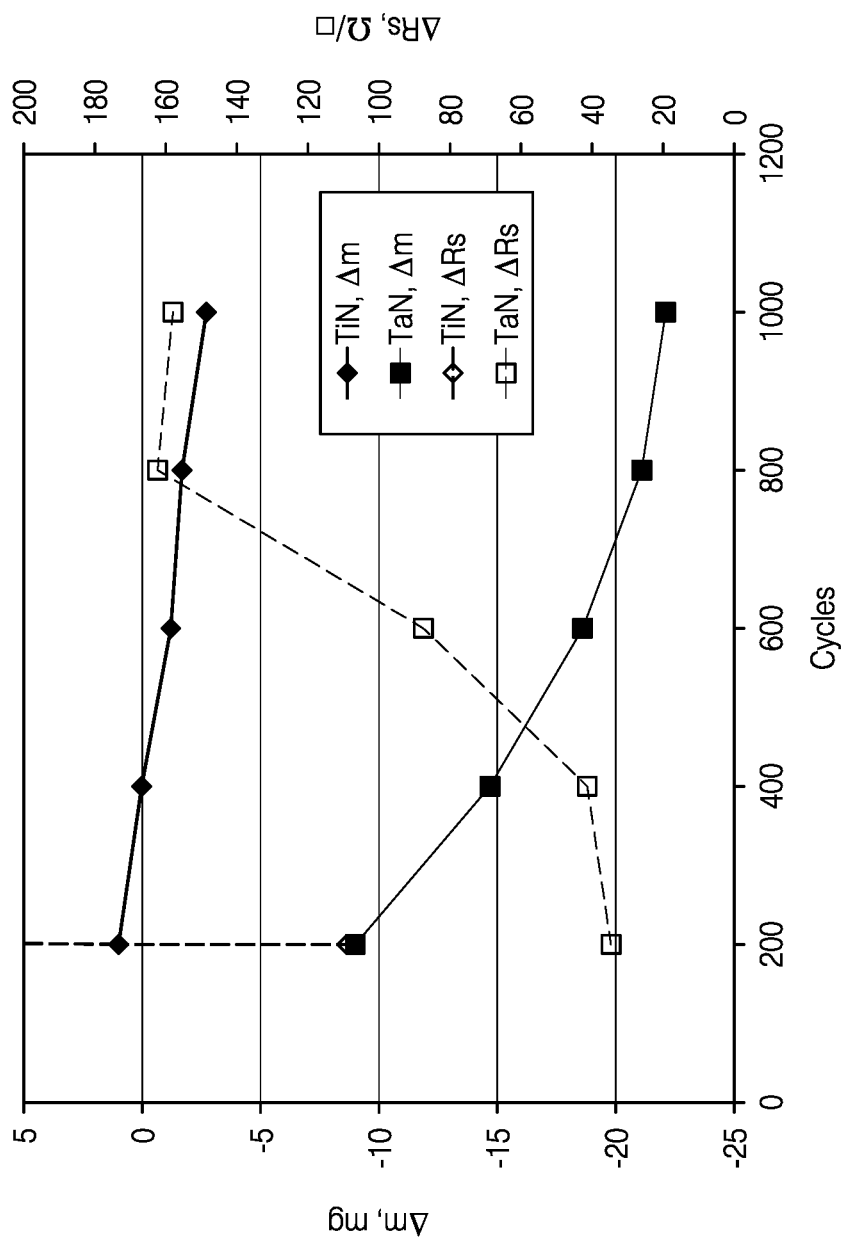
FIG. 7 is a graph showing the weight and sheet resistance of substrates comprising TiN and TaN films after varying numbers of ALE cycles using $NbF_5$ and $CCl_4$ as reactants.

FIG. 7 is a graph of the weight and sheet resistance changes of TiN and TaN films after varying numbers of ALE cycles with NbF$_5$ and CCl$_4$ at a reaction temperature of about 450° C. Visual inspection revealed complete removal of 20 nm TiN films at the center of the wafer after 400 cycles.

Figure 8:
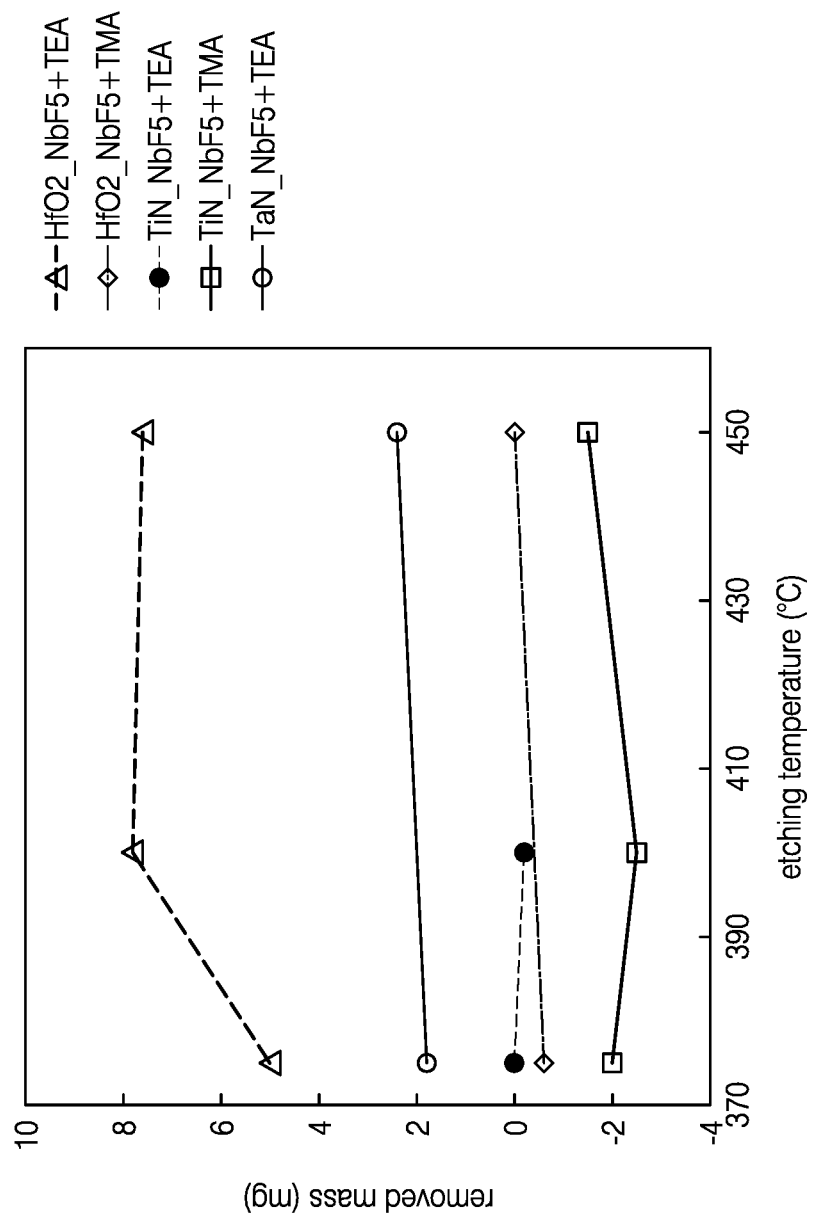
FIG. 8 is a graph showing the removed mass for AlN, TiN, $HFO_2$, and TaN films after ALE processing using a variety of reactants and etching temperatures in accordance with some embodiments.

FIG. 8 is a graph showing the removed mass (mg) of AlN, TiN, HfO$_2$, and TaN target films subjected to a variety of thermal atomic layer etch processes as described herein and according to some embodiments. Each target film was etched at a variety of reaction, or etching temperatures for each process. It was unexpectedly found that an atomic layer etch process including NbF$_5$ as a first reactant and triethylaluminum (TEA) or trimethylaluminum (TMA) as a second reactant resulted in removed mass from the TaN and AlN target films.

Figure 9:
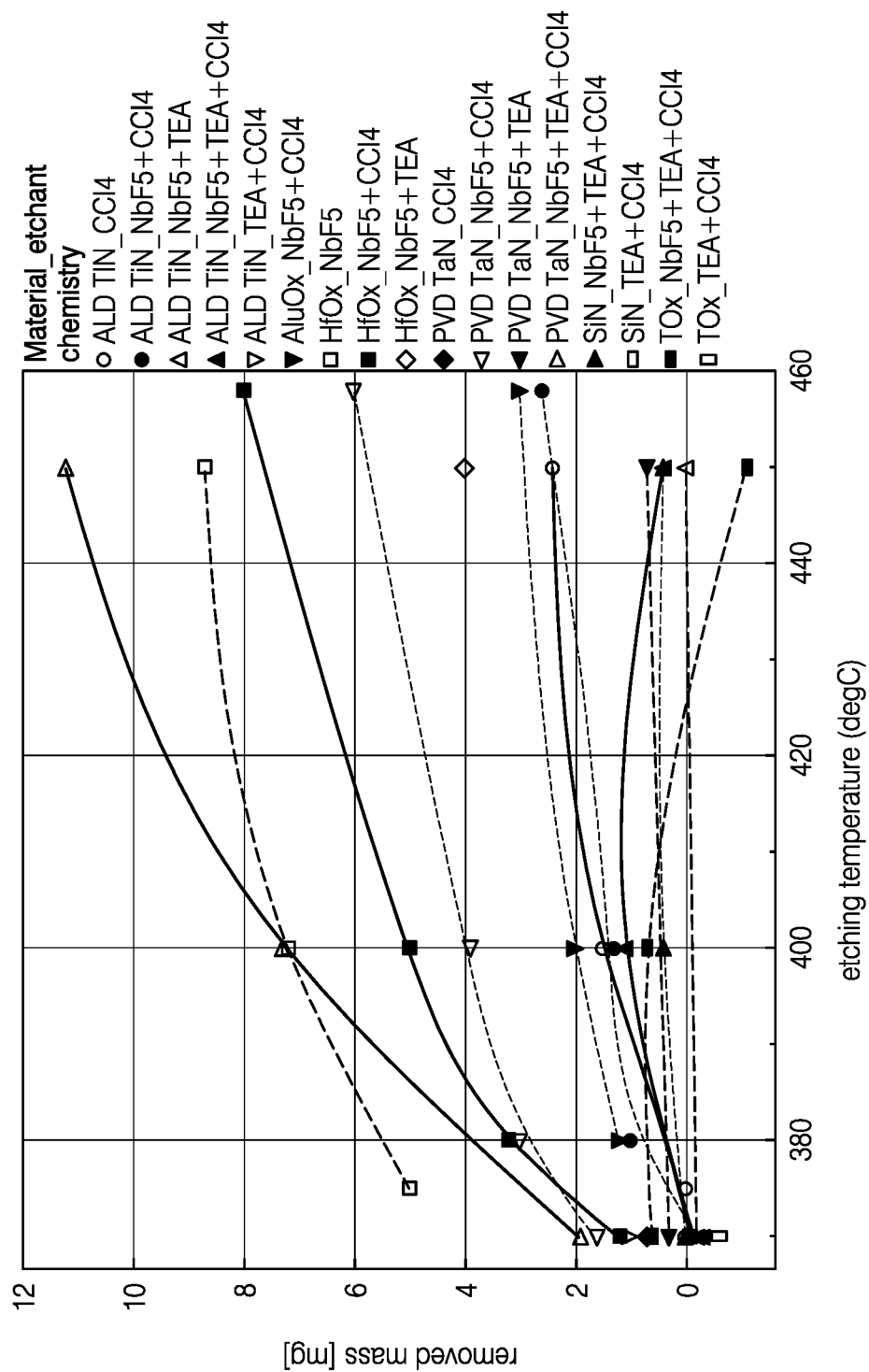
FIG. 9 is a graph showing the removed mass for TiN, AlN, AlOx, HfOx, TaN, SiN, and thermal oxide films after ALE processing using a variety of etch reactants and etching temperatures in accordance with some embodiments.

FIG. 9 is a graph showing the removed mas (mg) of TiN, AlN, AlOx, HfOx, TaN, SiN, and thermal oxide target films subjected to a variety of thermal atomic layer etch processes as described herein and according to some embodiments. Each target film was etched at a variety of etching temperatures for each process. It was unexpectedly found that ALE processes including NbF$_5$ and TEA as first and second reactants, ALE processes using TEA and CCl$_4$ as first and second reactants, and ALE processes using NbF$_5$, TEA, and CCl$_4$ as reactants resulted in removed mass from the target films.

It will be appreciated by those skilled in the art that various modifications and changes can be made without departing from the scope of the invention. Similar other modifications and changes are intended to fall within the scope of the invention, as defined by the appended claims.

What is claimed is:

1. A method of etching a film on a substrate in a reaction chamber by chemical atomic layer etching, the method comprising a plurality of etching cycles, each etching cycle comprising:
    exposing the substrate to a first vapor-phase non-metal oxyhalide reactant; and
    removing excess first vapor-phase non-metal oxyhalide halide reactant and byproducts from the reaction chamber,
    wherein the substrate is not contacted with a plasma reactant during the etching cycle.

2. The method of claim 1, further comprising exposing the substrate to a vapor-phase metal or semi-metal halide reactant.

3. The method of claim 2, wherein the vapor-phase metal or semi-metal halide reactant comprises Te, Sb, As, Nb, Ta, Mo, Sn, V, Re, Te, W or a group 6 transition metal.

4. The method of claim 2, wherein the vapor phase metal or semi-metal halide reactant comprises sulfur atoms.

5. The method of claim 2, wherein the vapor-phase metal or semi-metal halide reactant comprises oxygen atoms.

6. The method of claim 1, wherein the first vapor phase oxyhalide reactant comprises carbon, oxygen and halide atoms.

7. The method of claim 1, further comprising exposing the substrate to a second vapor-phase oxyhalide reactant.

8. The method of claim 7, wherein the etch cycle additionally comprises exposing the substrate to a third vapor-phase reactant that is different from the first and second vapor-phase oxyhalide reactants.

9. The method of claim 8, where the third vapor-phase reactant comprises oxygen.

10. The method of claim 9, wherein the third vapor-phase reactant comprises H$_2$O$_2$, HCOOH, H$_2$O, O$_2$ or O$_3$.

11. The method of claim 8, where the third vapor-phase reactant comprises a ligand exchanger.

12. The method of claim 11, wherein the third vapor-phase reactant comprises trimethylaluminum (TMA), Hacac, Sn(acac)$_2$, or Hhfac.

13. The method of claim 8, where the third vapor phase reactant comprises an adduct forming compound.

14. The method of claim 13, wherein the adduct forming compound is CS$_2$, CH$_3$CN, NH$_3$, SO$_3$, tris(2-aminoethyl) amine, triethanolamine, pyridine, tetrahydrofuran (THF), dimethylsulfoxide (DMSO), tetrahydrothiophene, 1, 4-dioxane, an isocyanate, a poly-ol, ethanolamine, a sulfone, trichloromethane, an alkyl or substituted isothiocyanate, trichloronitromethane, an alkyl, aryl or substituted nitrile, an isonitrile, a diamine, a dithione, a sulfone, TIPA, TIPEA, TMEA or a heterocylic reactive compound.

15. The method of claim 1, wherein the first vapor-phase non-metal oxyhalide reactant comprises a semi-metal.

16. The method of claim 1, wherein the first vapor-phase non-metal oxyhalide reactant does not comprise carbon.

17. The method of claim 1, wherein the first vapor-phase non-metal oxyhalide reactant does not comprise a hydrocarbon group.

18. The method of claim 1, wherein the first vapor-phase non-metal oxyhalide reactant does not comprise hydrogen.

19. The method of claim 1, wherein the first vapor-phase non-metal oxyhalide reactant does not comprise hydrogen or carbon.

20. The method of claim 1, wherein the first vapor-phase non-metal oxyhalide reactant comprises sulfur, halide and oxygen atoms.

21. The method of claim 1, wherein the first vapor-phase non-metal oxyhalide reactant comprises halide and nitrogen atoms.

22. The method of claim 1, wherein the first vapor-phase non-metal oxyhalide reactant comprises sulfur, halide and nitrogen atoms.

23. The method of claim 1, wherein the first vapor-phase non-metal oxyhalide reactant comprises sulfur, halide, oxygen and nitrogen atoms.

24. The method of claim 1, wherein the first vapor-phase non-metal oxyhalide reactant comprises of sulfur, halide, carbon and nitrogen atoms.

25. The method of claim 1, wherein the first vapor-phase non-metal oxyhalide reactant comprises of sulfur, halide, carbon, oxygen and nitrogen atoms.

26. The method of claim 1, wherein the substrate comprises two or more different materials that are exposed to the first vapor-phase non-metal oxyhalide reactant and one material is selectively etched relative to the other materials.

27. The method of claim 1, wherein the film comprises a metal oxide, metal carbide, metal nitride or is an elemental film.

28. The method of claim 27, wherein the film comprises Ti, Mo, Cu, Co, W, Si, Ta, Al, Zr, Hf, Ge, Pt, Ni, Zn, Nb 1r, Ru, Rh, or Sb.

29. The method of claim 1, wherein the temperature of the substrate during the etching cycle is 150° C. to 600° C.

30. The method of claim 1, wherein the substrate is a semiconductor wafer.

31. The method of claim 1, wherein the method has an average etch rate of 0.01 to 5 Å/cycle.

\* \* \* \* \*

UNITED STATES PATENT AND TRADEMARK OFFICE
CERTIFICATE OF CORRECTION

PATENT NO. : 11,230,769 B2
APPLICATION NO. : 16/881718
DATED : January 25, 2022
INVENTOR(S) : Blomberg et al.

Page 1 of 2

It is certified that error appears in the above-identified patent and that said Letters Patent is hereby corrected as shown below:

On the Title Page

Page 2, Column 1 (Other Publications), Line 14, delete "Chern." and insert --Chem.--.

Page 2, Column 2 (Other Publications), Line 3, delete "Chern." and insert --Chem.--.

Page 2, Column 2 (Other Publications), Line 6, delete "RCOC1,"" and insert --RCOCl,"--.

Page 2, Column 2 (Other Publications), Line 37, delete "Ar." and insert --Ar plasmas.--.

Page 2, Column 2 (Other Publications), Line 49, delete "NF3/02" and insert --NF3/O2--.

Page 2, Column 2 (Other Publications), Line 62, delete "Sulferic" and insert --Sulfuric--.

Page 3, Column 1 (Other Publications), Line 11, delete "WOCl4"," and insert --WOC14",--.

Page 3, Column 2 (Other Publications), Line 5, delete "Slution" and insert --Solution--.

In the Specification

Column 1, Line 50, delete "sirface" and insert --surface--.

Column 7, Line 26, delete "triflouride" and insert --trifluoride--.

Column 8, Line 51, delete "NO$_2$SbF$_6$," and insert --(NO$_2$SbF$_6$),--.

Column 13, Line 24, delete "(SO$_3$)," and insert --(SO$_3$).--.

Column 13, Line 44, delete "thiadizole" and insert --thiadiazole--.

Signed and Sealed this
Twenty-eighth Day of June, 2022

Katherine Kelly Vidal
*Director of the United States Patent and Trademark Office*

CERTIFICATE OF CORRECTION (continued)
U.S. Pat. No. 11,230,769 B2

Column 13, Line 44, delete "dicholor-thiadiazole," and insert --dicholoro-thiadiazole,--.

Column 13, Line 45, delete "3,4 dichloro-1,2,5 thiadiazole." and insert
--3,4 dichloro-1,2,5-thiadiazole.--.

Column 13, Line 50, delete "cyclopentadine," and insert --cyclopentadiene,--.

Column 13, Line 67, delete "products" and insert --products.--.

Column 15, Line 29, delete "hexafluoro acetylacetonato" and insert --hexafluoroacetylacetone--.

Column 15, Line 34-35, delete "and or" and insert --and/or--.

Column 20, Line 43, delete "and or/by" and insert --and/or by--.

Column 22, Line 53 (approx.), delete "03:" and insert --$O_3$;--.

Column 23, Line 22, delete "Tin," and insert --TiN,--.

In the Claims

Column 24, Line 63, Claim 14, delete "heterocylic" and insert --heterocyclic--.

Column 26, Line 13, Claim 28, delete "Nb 1r," and insert --Nb, Ir,--.